United States Patent
Noma et al.

(10) Patent No.: US 9,898,859 B2
(45) Date of Patent: Feb. 20, 2018

(54) APPARATUS AND METHOD FOR MANAGING STRUCTURE DATA

(71) Applicant: FUJITSU LIMITED, Kawasaki-shi, Kanagawa (JP)

(72) Inventors: Yui Noma, Kawasaki (JP); Makiko Konoshima, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 169 days.

(21) Appl. No.: 14/637,739

(22) Filed: Mar. 4, 2015

(65) Prior Publication Data
US 2015/0279097 A1    Oct. 1, 2015

(30) Foreign Application Priority Data

Mar. 31, 2014 (JP) ................. 2014-072504

(51) Int. Cl.
- *G06T 17/10* (2006.01)
- *G06T 11/20* (2006.01)
- *G06F 17/30* (2006.01)
- *G06F 17/50* (2006.01)

(52) U.S. Cl.
CPC ........ *G06T 17/10* (2013.01); *G06F 17/30271* (2013.01); *G06F 17/50* (2013.01); *G06T 11/206* (2013.01); *G06T 2200/04* (2013.01)

(58) Field of Classification Search
None
See application file for complete search history.

(56) References Cited

U.S. PATENT DOCUMENTS

| | | | | |
|---|---|---|---|---|
| 6,631,364 | B1* | 10/2003 | Rioux | G06F 17/3025 |
| 2002/0004710 | A1* | 1/2002 | Murao | G06T 17/005 |
| | | | | 702/167 |
| 2008/0036765 | A1 | 2/2008 | Hariya et al. | |
| 2013/0077872 | A1* | 3/2013 | Kitamura | G06K 9/6211 |
| | | | | 382/203 |

FOREIGN PATENT DOCUMENTS

| | | |
|---|---|---|
| JP | 2000-222428 | 8/2000 |
| JP | 2000-222573 | 8/2000 |
| JP | 2001-155019 | 6/2001 |
| JP | 2001-307111 | 11/2001 |

(Continued)

OTHER PUBLICATIONS

Chinese Office Action dated Apr. 13, 2017 for corresponding Chinese Patent Application No. 201510130046.X, with English Translation, 20 pages.

(Continued)

*Primary Examiner* — Yi Wang
(74) *Attorney, Agent, or Firm* — Fujitsu Patent Center

(57) ABSTRACT

A storage unit stores structure data that includes coordinates of vertices of a plurality of polygons representing a three-dimensional structure. A computation unit calculates coordinates of a certain point with reference to the structure data. This point is used, together with the vertices of the polygons, to produce a graph from the structure data according to spatial arrangement of the polygons and further to calculate characteristic quantities based on the produced graph. The computation unit stores the calculated coordinates of the point in a memory device, as a piece of information relating to the structure data.

6 Claims, 23 Drawing Sheets

(56) References Cited

FOREIGN PATENT DOCUMENTS

| JP | 2006-520948 | 9/2006 |
|---|---|---|
| JP | 2008-040921 | 2/2008 |
| WO | 01/46857 | 6/2001 |
| WO | 2004/068300 | 8/2004 |

OTHER PUBLICATIONS

Benjamin Bustos, et al., "Feature-Based Similarity Search in 3D Object Databases", ACM Computing Surveys, vol. 37, No. 4, Dec. 2005, pp. 345-387 (43 pages).

Vleugels J. et al., "Efficient Image Retrieval Through Vantage Objects", Security in Communication Networks: Third International Conference; Revised Papers / SCN 2002, Amalfi, Italy, Sep. 11-13, 2002, [Lecture notes in computer science, ISSN 0302-9743], Springer Verlag, DE, vol. 1614, Jun. 2, 1999, pp. 575-585 (11 pages).

Extended European Search Report dated Aug. 4, 2015 for corresponding European Application No. 15158600.5 (14 pages).

Korean Office Action dated Apr. 19, 2016 for corresponding Korean Patent Application No. 10-2015-0041818, with English Translation, 9 pages.

* cited by examiner

FIG. 3A  EXAMPLE OF STRUCTURE
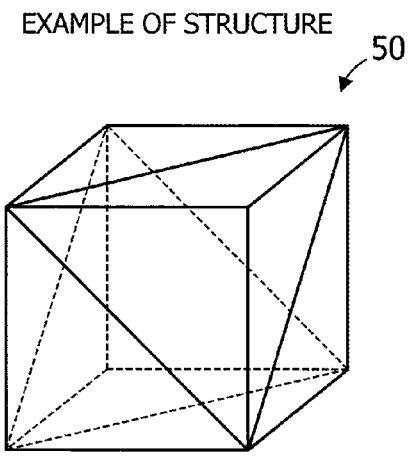
FIG. 3B  EXAMPLE OF POLYGON
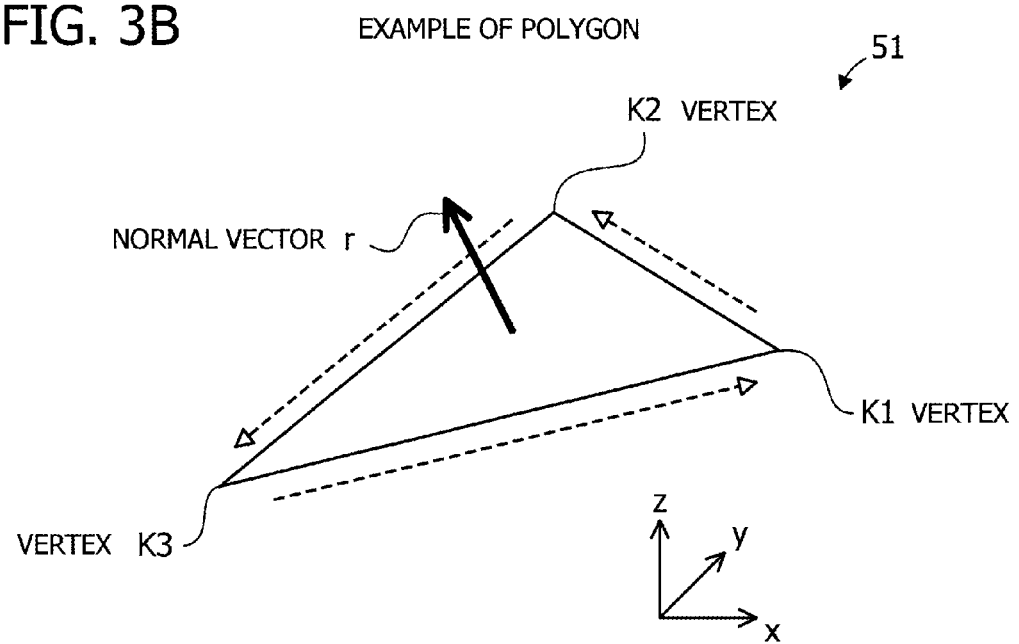

EXAMPLE OF POSITION VECTORS OF i-TH POLYGON

FIG. 7

EXAMPLE OF STRUCTURE DATA
111

```
1   solid structure A
2   facet normal r1 r2 r3
3   outer loop
4   vertex x1 y1 z1
5   vertex x2 y2 z2
6   vertex x3 y3 z3
7   endloop
8   endfacet
9   facet normal r4 r5 r6
10  outer loop
11  ...
12  endloop
13  endfacet
14  ...
15  endsolid
```

FIG. 9

EXAMPLE OF GRAPH DATA 113

```
1   <?xml version="1.0" encoding="UTF-8"?>
2   <graphml xmlns="http://...">
3     <key id="key0" for="edge" attr.name="weight" attr.type="double" />
4     <key id="key1" for="node" attr.name="isReference" attr.type="bool" />
5     <graph id="G" edgedefault="undirected" parse.nodeids="canonical"
6       parse.edgeids="canonical" parse.order="nodesfirst">
7       <node id="n0">
8         <data key="key1">false</data>
9       </node>
10  ...
11      <node id="n5">
12        <data key="key1">false</data>
13      </node>
14      <node id="n6">
15        <data key="key1">true</data>
16      </node>
17      <edge id="e0" source="n1" target="n0">
18        <data key="key0">1.5</data>
19      </edge>
20      <edge id="e1" source="n2" target="n0">
21        <data key="key0">18.6409</data>
22      </edge>
23      <edge id="e2" source="n2" target="n1">
24        <data key="key0">18.6409</data>
25      </edge>
26  ...
27      <edge id="e8" source="n6" target="n5">
28        <data key="key0">14</data>
29      </edge>
30    </graph>
31  </graphml>
32
33
```

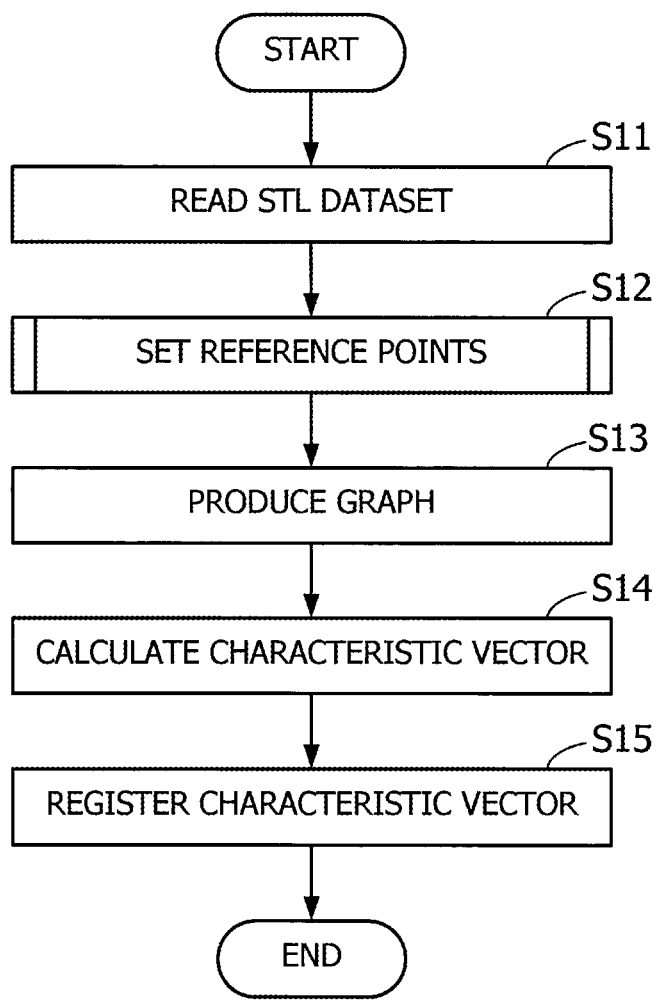

FIG. 20

| CHARACTERISTIC VECTOR TABLE | | | | 114 |
|---|---|---|---|---|
| STRUCTURE | PATTERN 1 (SECOND MOMENT) | PATTERN 2 (BARYCENTER $\nu$) | PATTERN 3 (POLYGON DENSITY) | |
| STRUCTURE A | V11 | V12 | V13 | |
| STRUCTURE B | V21 | V22 | V23 | |
| ... | ... | ... | ... | |

APPARATUS AND METHOD FOR MANAGING STRUCTURE DATA

CROSS-REFERENCE TO RELATED APPLICATION

This application is based upon and claims the benefit of priority of the prior Japanese Patent Application No. 2014-072504, filed on Mar. 31, 2014, the entire contents of which are incorporated herein by reference.

FIELD

The embodiments discussed herein relate to an apparatus and method for managing structure data.

BACKGROUND

Various software tools for three-dimensional modeling are used today, including computer-aided design (CAD) systems that help draftsmen create drawings. CAD software runs on a computer, permitting the user to draft a three-dimensional structure on a display screen by entering values and commands and manipulating graphical objects using input devices. Viewing pictures on the screen, the user creates a drawing while keeping the structure's solid image in his or her mind.

Three-dimensional coordinate data of a solid object is used to represent its spatial shape in a computer. For example, the Standard Triangulated Language (STL) is a data format for describing three-dimensional shapes. STL format uses a set of triangles to express the shape of a three-dimensional model. To describe each such triangle, STL data includes the coordinates of its three vertices (corners) and a normal vector of its triangular plane.

CAD users may sometimes need to search for existing three-dimensional models in relation to a specific model. For example, an engineer engaged in designing a component of a product may wish to ensure that he or she is not reinventing the wheel (i.e., creating a mere duplicate of an existing component design), which is best avoided. The engineer uses a conventional similarity search method to retrieve existing three-dimensional models that resemble a specified model in shape. For example, one such method quantifies geometric features of each three-dimensional model. The resulting value is referred to as a characteristic quantity. When two models have similar characteristic quantities, they are supposed to be similar in shape. It is also possible to calculate a plurality of characteristic quantities in several different aspects of a single three-dimensional model. These characteristic quantities form a characteristic vector for use in a similarity search of models.

For example, characteristic quantities of a model may be obtained as a distribution of distances between the center of mass and faces of the model. Another proposed method uses the average of crease angles each formed by the normal vectors of two adjacent faces. Yet another proposed method produces nodes of an analytical tree by mapping patches constituting a three-dimensional model to them and generates a neighborhood graph by placing an edge to each pair of geometrically adjacent nodes. The trees produced in this way are used to detect differences in shape between two or more models. Still another proposed method reduces a complex three-dimensional model into a simplified model called "skeleton." Some significant features are then extracted from the model and its skeleton, and the resulting characteristic vector is registered in a database. See, for example, the following documents:

Japanese Laid-open Patent Publication No. 2000-222428
   Japanese Laid-open Patent Publication No. 2001-307111
   Japanese National Publication of International Patent Application No. 2006-520948

As noted above, a three-dimensional structure may be expressed as a set of polygons (e.g., STL data is a collection of triangles), where each vertex of the structure corresponds to a vertex of a polygon, and each edge between two vertices of the structure corresponds to a shared edge of polygons. Structure data may be formed into a graph by mapping the structure's vertices and edges to graph nodes and edges, and characteristic quantities calculated from such graph data are used to seek similar shapes. This graph data, however, lacks the information about angles formed by polygon edges of a structure, thus making it difficult to reflect the structure's convex or concave features in the characteristic quantities. It is indeed not realistic to include every edge-to-edge angle in graph data because of its consequent increase in data size.

SUMMARY

In one aspect of the embodiments discussed herein, there is provided a non-transitory computer-readable storage medium storing a program that causes a computer to perform a procedure. This procedure includes: calculating coordinates of a point with reference to structure data that includes coordinates of vertices of a plurality of polygons representing a three-dimensional structure, the point being to be used together with the vertices of the polygons to produce a graph from the structure data according to spatial arrangement of the polygons and further to calculate characteristic quantities based on the produced graph; and storing the calculated coordinates of the point in a memory device as a piece of information relating to the structure data.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 3A and 3B illustrate an example of structures and polygons handled in the second embodiment;

FIG. 7 illustrates an example of an STL dataset used in the second embodiment;

FIG. 9 illustrates an example of graph data produced in the second embodiment;

FIG. 11 is a flowchart illustrating an example of a vector registration process performed in the second embodiment;

FIG. 20 illustrates an example of a characteristic vector table used in a fifth embodiment;

DESCRIPTION OF EMBODIMENTS

Several embodiments will be described below with reference to the accompanying drawings.

(a) First Embodiment

Figure 1:
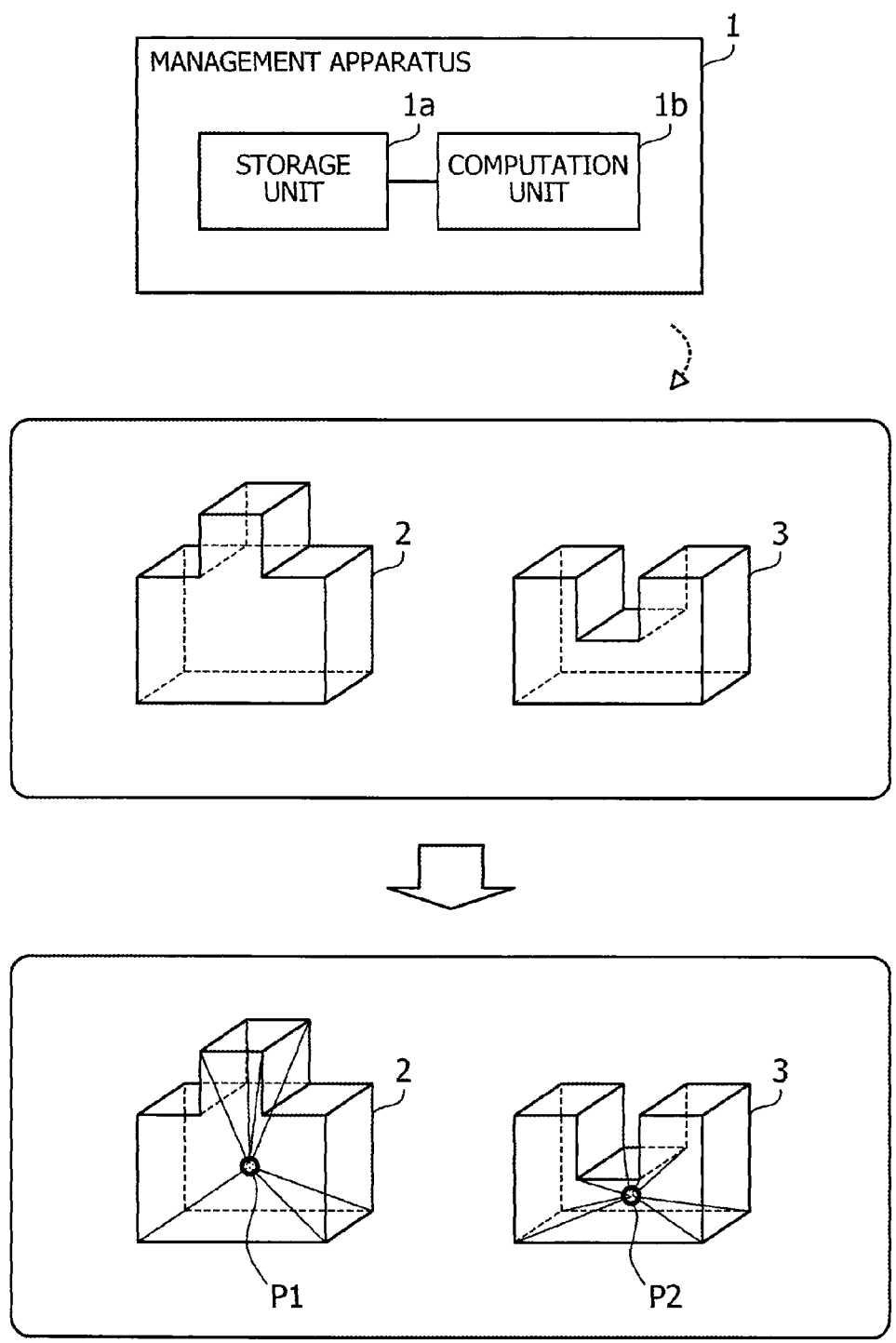
FIG. 1 illustrates a management apparatus according to a first embodiment.

FIG. 1 illustrates a management apparatus according to a first embodiment. The illustrated management apparatus 1 manages a library of structure data that describes three-dimensional structures. The management apparatus 1 receives a search query from a user, which specifies structure data of a specific structure. In response, the management apparatus 1 searches its managed library to find other structures that resemble in shape the structure specified in the received query. During this course, the management apparatus 1 forms structure data into a graph and calculates a characteristic quantity from the produced graph. This characteristic quantity of structure data may also be referred to as a "graph characteristic quantity." A plurality of characteristic quantities (or a characteristic vector formed from them), rather than a single such quantity, may be used to represent distinctive features of each structure, so that a search of structures is performed by comparing their characteristic vectors. When the query is executed, the management apparatus 1 outputs its search result on a display device attached to the management apparatus 1 or transmits the same to the user's terminal device.

The management apparatus 1 calculates characteristic quantities on the following two occasions. The first is when setting up a library of structure data so as to make characteristic quantities ready for use in search operations. The second is when executing a search query received from a user. The management apparatus 1 calculates characteristic quantities of structure data specified in the query. The management apparatus 1 compares the latter characteristic quantities with the former ones, thereby finding existing structure data in the library which resembles the one specified in the search query. The data processing operations described below are applied to either of the above-noted first and second occasions.

The management apparatus 1 includes a storage unit 1a and a computation unit 1b. The storage unit 1a may be formed from volatile storage devices such as random access memory (RAM) or non-volatile storage devices such as hard disk drive (HDD) and flash memory. The computation unit 1b includes a processor such as a central processing unit (CPU) and digital signal processor (DSP). The processor may also be implemented with an application-specific integrated circuit (ASIC), field-programmable gate array (FPGA), or other electronic circuits designed or configured to provide special functions. Here the term "processor" is used to refer to a single processing device or a multiprocessor system including two or more processing devices. The processor may be configured to execute programs stored in the storage unit 1a or other storage locations.

The storage unit 1a stores structure data, which represents each registered structure as a collection of polygons in a three-dimensional space. More specifically, curved surfaces of a structure are approximated with a combination of flat polygons. The term "polygon" denotes a closed plane figure bounded by straight lines. Polygons are elements for modeling an object in the three-dimensional space. For example, the STL data format uses triangles to express the shape of a solid object. The first embodiment and other embodiments discussed in this description are, however, not limited by the use of triangles as polygonal elements, but may be configured to handle quadrangles, pentagons, or any other kind of polygons.

With reference to the structure data stored in the storage unit 1a, the computation unit 1b calculates coordinates of at least one point that is used to produce a graph from structure data and further calculate characteristic quantities from the graph. Here, the graph is produced according to the spatial arrangement of polygons constituting the given structure data, and in this course, the noted point is used together with the vertices of these polygons. The computation unit 1b registers the calculated point coordinates in a memory device as a piece of information relating to the structure data. This memory device may be an integral part of the management apparatus 1 or, alternatively, a remote device that can be reached by the management apparatus 1 via a network, for example. Further the memory device may offer its space to implement the storage unit 1a described above.

Referring to the example seen in FIG. 1, the storage unit 1a stores first structure data representing a first structure 2 and second structure data representing a second structure 3. The first structure 2 is a polyhedron having a protrusion on its upper surface as viewed in FIG. 1. The second structure 3 is a polyhedron having a recess on its upper surface. Both of these structures 2 and 3 are formed from a plurality of polygons. The vertices (corners) and edges of a structure correspond to those of polygons. More specifically, one vertex of the first structure 2 corresponds to a point at which three or more polygons meet. One edge connecting two vertices of the first structure 2 corresponds to a common edge of two adjacent polygons.

The computation unit 1b calculates coordinates of a point P1 according to spatial arrangement of polygons given by the first structure data. This point P1 does not match with any of the vertices of the first structure 2. For example, the computation unit 1b may place the point P1 at the center of mass of the first structure 2. More specifically, the center of mass is calculated from the locations of polygons constituting the first structure 2, assuming that the first structure 2 is uniform in density. The computation unit 1b stores the calculated coordinates of point P1 in a memory device, as a piece of information relating to the first structure data representing the first structure 2.

The computation unit 1b similarly calculates coordinates of another point P2 according to spatial arrangement of polygons given by the second structure data. For example, this point P2 may be placed at the center of mass of the second structure 3. The computation unit 1b stores the calculated coordinates of point P2 in the memory device, as a piece of information relating to the second structure data representing the second structure 3.

In operation of the management apparatus 1 described above, the coordinates of at least one point are calculated with reference to structure data that includes coordinates of vertices of a plurality of polygons representing a three-dimensional structure. The calculated point is to be used together with the vertices of polygons to produce a graph from the structure data according to spatial arrangement of the polygons and further to calculate characteristic quantities from the produced graph. The calculated coordinates of these points are stored in a memory device as a piece of information relating to the structure data. These features of the first embodiment enable the management apparatus 1 to obtain coordinates of a point for use in a search of structures.

For example, point P1 is treated as a node in a graph, just as the vertices (corners) of the first structure 2 are expressed as nodes in the graph. This means that the graph is formed from a plurality of nodes corresponding to point P1 and those vertices and a plurality of edges corresponding to line segments (or polygon edges) each connecting between two vertices, including point P1. Characteristic quantities of the first structure 2 are then calculated with reference to the graph. For its rotational invariance in shape, the graph does not assign fixed coordinates to its constituent nodes, but instead gives some weights to the edges. For example, the weight of a graph edge is proportional to the length of its corresponding polygon edge. The graph nodes are given a fixed weight (e.g., 1).

Think of, for example, a plurality of line segments drawn from point P1 to the vertices of the first structure 2. When producing a first graph representing the first structure 2, the computation unit 1b treats these line segments as edges, so that the resulting first graph will reflect the spatial relationships between point P1 and each vertex of the first structure 2. Referring to the first structure 2 in FIG. 1, the spatial relationships between point P1 and some vertices constituting a protrusion may be reflected in the first graph. More specifically, several line segments (or edges) are drawn from point P1 to each vertex constituting the top face of the protrusion, as well as to each vertex constituting the bottommost face of the first structure 2 as viewed in FIG. 1. While not depicted in FIG. 1, more line segments (or edges) may be drawn to connect point P1 with other vertices of the first structure 2. The same operations similarly apply to the second structure 3 in order to produce a second graph that reflects spatial relationships between point P2 and vertices of its recess. Referring to the second structure 3 seen in FIG. 1, several line segments (or edges) are drawn from point P2 to each vertex constituting the bottom of the groove, as well as to each vertex constituting the bottommost face of the second structure 3. While not depicted in FIG. 1, more line segments (or edges) may be drawn to connect point P2 with other vertices of the second structure 3.

The first graph produced from the first structure 2 with consideration of point P1 has an emphasis on its protruding shape. In contrast, the second graph produced from the second structure 3 with consideration of point P2 has an emphasis on its recessing shape. These graphs are then subjected to a set of processing operations. The resulting characteristic quantities (or characteristic vector) of the first graph may be compared with those of the second graph, thereby identifying their differences (i.e., protrusion versus recess) in a proper manner.

The coordinates of point P1 and point P2 may be determined with several different methods. For example, these points may have some offset from the structure's center of mass, depending on the deviation of polygon locations in a space. More specifically, the offset of point P1 may be calculated on the basis of the second or higher-degree moment with respect of a principal component direction of the first structure 2. As another example, the internal space or surrounding space of the first structure 2 may be searched to find a local concentration of polygons (e.g., a sphere with a predetermined radius that is populated with many polygons). A new point is then placed in the found local space. Relatively planar surfaces of a structure can be modeled with a smaller number of polygons. Reversely, the presence of a spatial region with a high polygon density suggests that the structure has a distinguishable protrusion or recess in that region. A new point may then be placed in or near the found region, so that the distinct shape of the structure will be reflected in a graph produced from the same. Accordingly, characteristic quantities calculated from this graph clearly represent such geometric features of the structure of interest.

As mentioned above, the graph does not assign fixed coordinates to its constituent nodes, but gives some weights to the edges, so as to maintain its rotational invariance. It could be an alternative solution to produce a complete graph of a structure, in which every two nodes are connected by an edge. This alternative solution, however, increases the amount of graph data too far and thus raises computational costs for the calculation of characteristic quantities. The same problem would occur to another alternative solution in which the graph includes the value of each angle formed by polygon edges. In contrast, the proposed management apparatus 100 maintains geometric features of a structure in its corresponding graph by placing an additional point apart from vertices of the structure, advantageously with a smaller amount of graph data and faster computation of characteristic quantities than such alternatives.

(b) Second Embodiment

Figure 2:
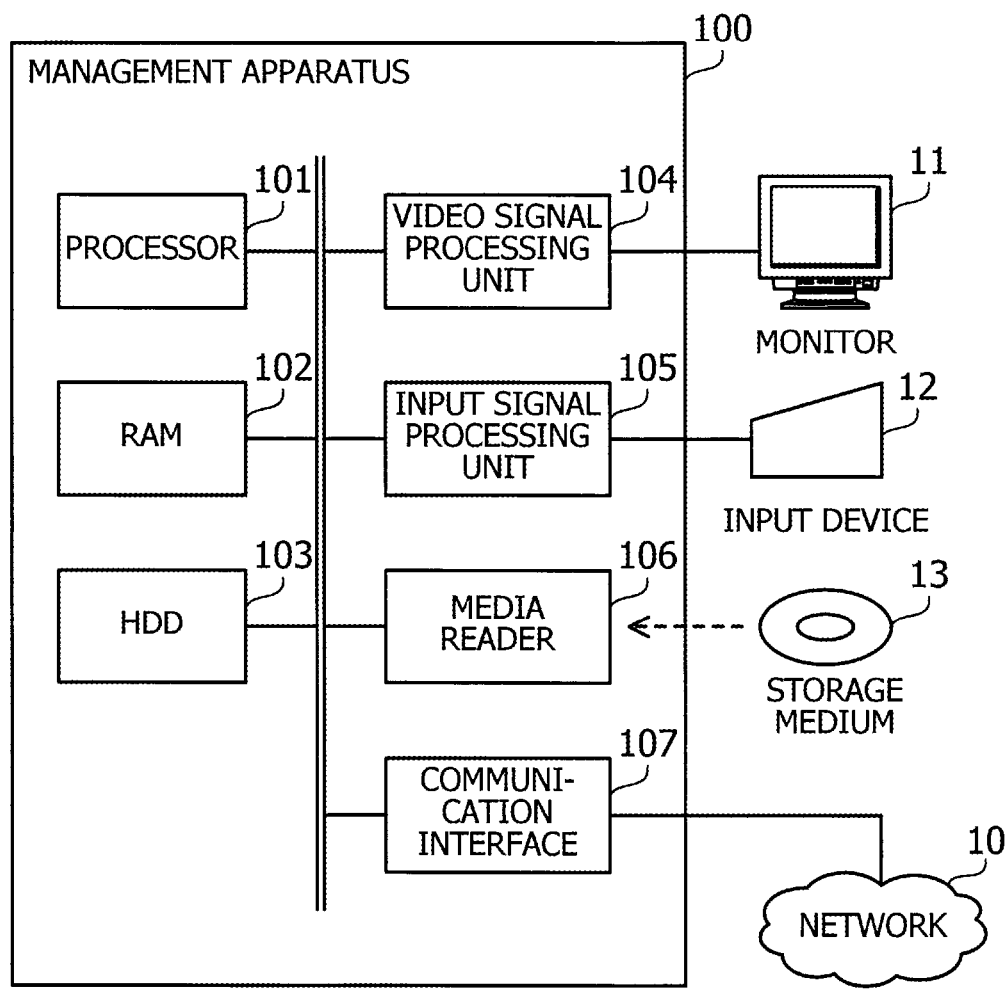
FIG. 2 illustrates an exemplary hardware configuration of a management apparatus according to a second embodiment.

FIG. 2 illustrates an exemplary hardware configuration of a management apparatus according to a second embodiment. The illustrated management apparatus 100 helps a CAD user to design a three-dimensional structure. The management apparatus 100 displays a three-dimensional figure on its attached monitor device interactively with the user. During this course, the user may command the management apparatus 100 to conduct a search for some existing (finalized) structure data in a library.

For example, the user draws a specific three-dimensional structure using the management apparatus 100 and commands the management apparatus 100 to seek other structures similar to the structure that he or she has drawn. In response to this user command, the management apparatus 100 searches the library for existing structures whose shapes resemble the specified one and provides the user with similar structures that are found. As mentioned above, the library is a database storing finalized design data of structures, which may be implemented as part of a built-in storage device of the management apparatus 100 or as a separate storage device that is reachable from the management apparatus 100 via a network 10. Structures are each represented as a three-dimensional model (polyhedron). The following description may refer to such models simply as "structures."

The management apparatus 100 includes a processor 101, a RAM 102, an HDD 103, a video signal processing unit 104, an input signal processing unit 105, a media reader 106, and a communication interface 107. All these components are connected to a bus of the management apparatus 100.

The processor 101 controls data processing operations to be performed in the management apparatus 100. The processor 101 may be a single processing device or a multi-processor system including two or more processing devices. For example, the processor 101 may be a CPU, DSP, ASIC, FPGA, or any combination of them.

The RAM 102 serves as a primary storage device in the management apparatus 100. Specifically, the RAM 102 is used to temporarily store at least some of the operating system (OS) programs and application programs that the processor 101 executes, in addition to other various data objects that the processor 101 manipulates at runtime.

The HDD 103 serves as a secondary storage device in the management apparatus 100 to store program and data files of the operating system and applications. The HDD 103 writes and reads data magnetically on its internal platters. The management apparatus 100 may include one or more non-volatile storage devices such as flash memories and solid state drives (SSD) in place of, or together with the HDD 103.

The video signal processing unit 104 produces video images in accordance with commands from the processor 101 and displays them on a screen of a monitor 11 coupled to the management apparatus 100. The monitor 11 may be, for example, a cathode ray tube (CRT) display or a liquid crystal display.

The input signal processing unit 105 receives input signals from input devices 12 and supplies them to the processor 101. The input devices 12 may be, for example, a keyboard and a pointing device such as a mouse, digitizer, and touchscreen.

The media reader 106 is used to read programs and data files stored in a storage medium 13, which may be, for example, a magnetic disk medium such as flexible disk (FD) and HDD, an optical disc medium such as compact disc (CD) and digital versatile disc (DVD), or a magneto-optical storage medium such as magneto-optical disc (MO). Non-volatile semiconductor memory (e.g., flash memory card) is another possible type of the storage medium 13. The media reader 106 transfers programs and data read out of such a storage medium 13 to, for example, the RAM 102 or HDD 103 according to commands from the processor 101.

Lastly, the communication interface 107 permits the processor 101 to communicate with other apparatuses (not illustrated) via the network 10.

FIGS. 3A and 3B illustrate an example of structures and polygons handled in the second embodiment. The following description assumes that the shape of a structure is expressed as structure data in the format of STL (i.e., as a collection of triangles). The second embodiment is, however, not limited by this assumption, but may use other kinds of polygons to model a structure.

FIG. 3A illustrates an example of a structure. This structure 50 is a rectangular solid, whose outer surfaces are triangulated, or subdivided into a plurality of triangles. More specifically, each rectangular face of the structure 50 in FIG. 3A is formed from two triangles. Each vertex of the structure 50 corresponds to one shared vertex of three triangles, and each edge of the same corresponds to one shared edge of two triangles.

FIG. 3B illustrates an example of a polygon. Data of this polygon 51 defines the positions of its three vertices K1, K2, and K3, as well as giving a normal vector r that is perpendicular to the polygonal plane. The normal vector r may be a unit vector (i.e., a vector with a length of one). The vertex positions and normal vector are expressed with x, y, and z coordinate values in a Cartesian space.

STL data of the polygon 51 may be configured such that the order of three vertices K1, K2, and K3 indicates which surface of the polygon 51 is its outer face. For example, the coordinates of vertices K1, K2, and K3 are defined in that order when the outer face of the polygon 51 is viewed as in FIG. 3B. That is, the vertices of a polygon are defined in the counterclockwise order along the edges of its outer face, as indicated by the broken-line arrows in FIG. 3B. As noted above, all polygons in the present context are triangular in shape. The term "polygon" may be used below to refer to that particular type of polygons.

Figure 4:
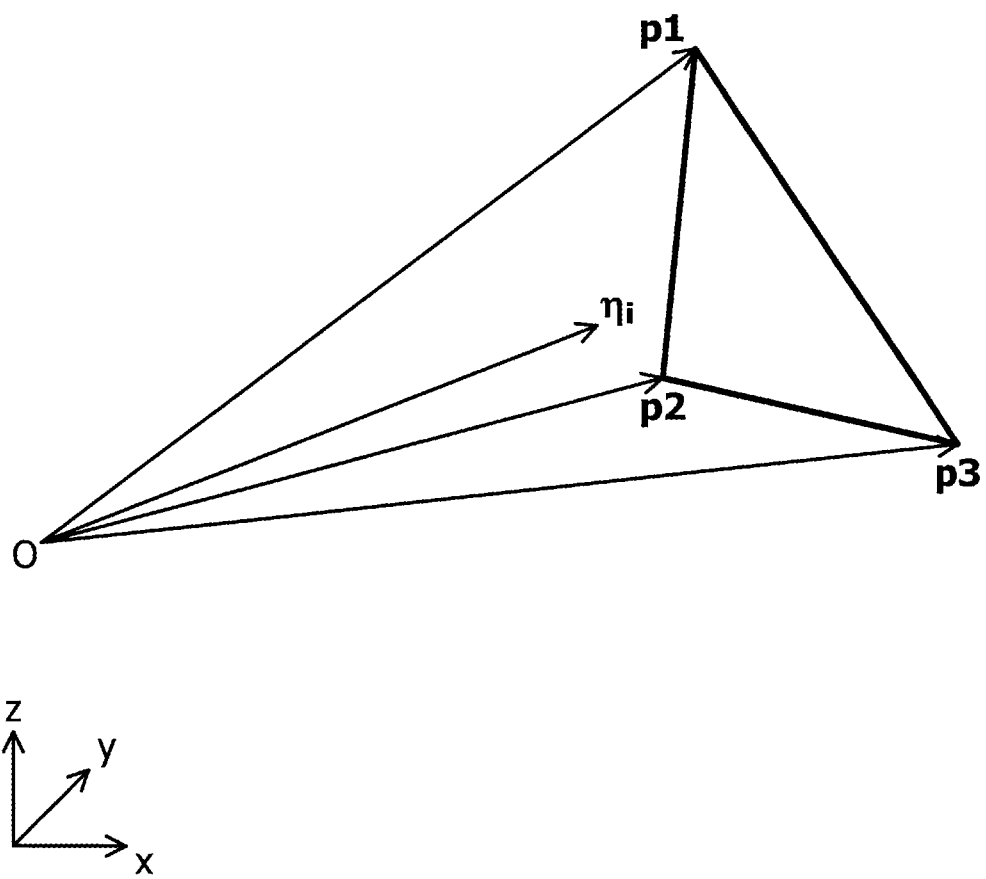
FIG. 4 illustrates an example of vectors relating to a polygon in the second embodiment.

FIG. 4 illustrates an example of vectors relating to a polygon in the second embodiment. The shape of a structure is defined as N polygons, where N is an integer greater than three. FIG. 4 illustrates the i-th polygon and several position vectors relating to it, where i is an integer in the range of $1 \leq i \leq N$.

Vectors $p_1$, $p_2$, and $p_3$ point from the coordinate origin O to the three vertices of the i-th polygon of interest. Although every polygon has its own such vectors $p_1$, $p_2$, and $p_3$, the illustrated example omits the suffix i for simplicity purposes. The origin O and three vertices of the i-th polygon form a tetrahedron, and vector $\eta_i$ indicates the center of mass of this tetrahedron.

Figure 5:
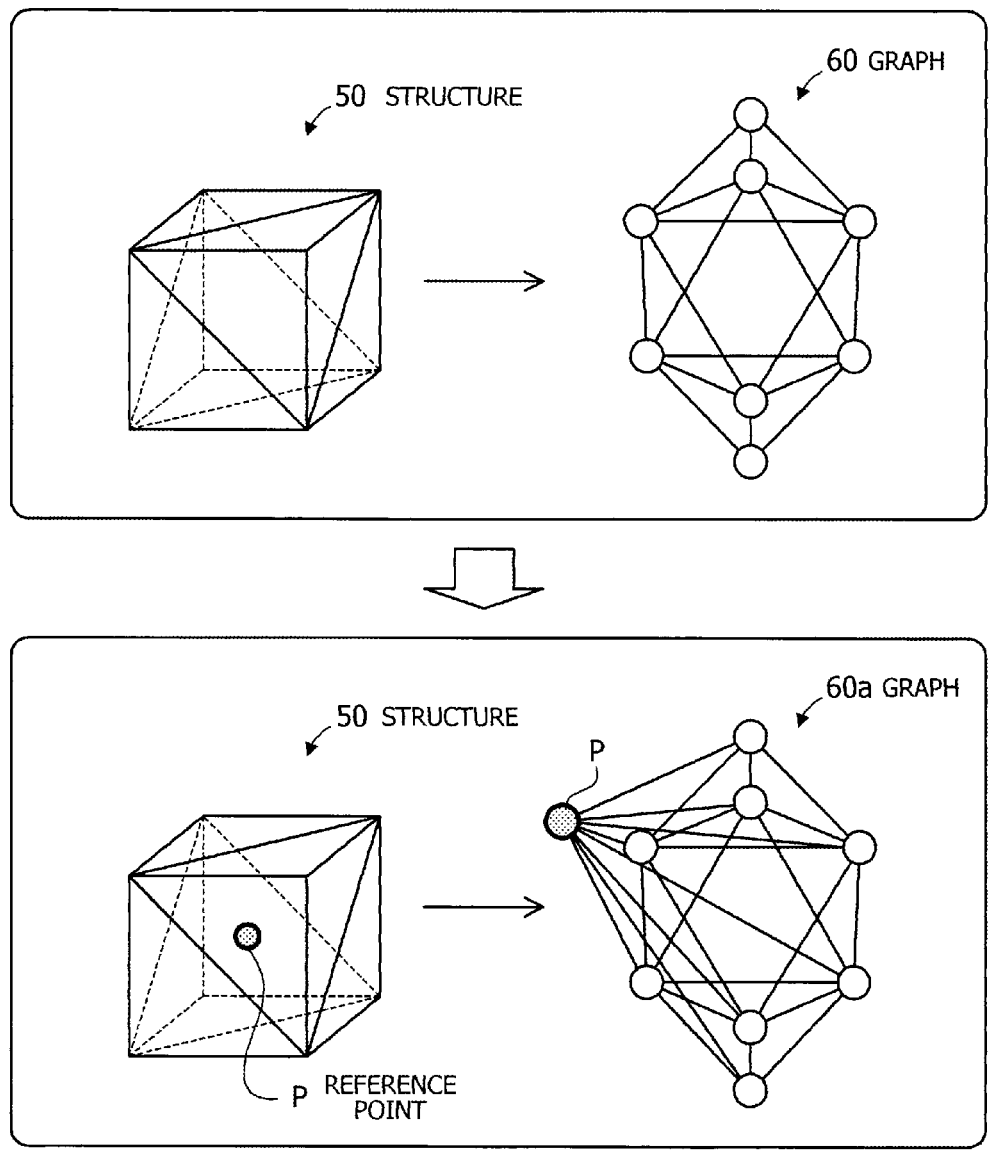
FIG. 5 illustrates an example of graphs produced in the second embodiment.

FIG. 5 illustrates an example of graphs produced in the second embodiment. The illustrated structure 50 may simply be turned into a graph 60, whose eight nodes correspond to eight corners of the structure 50 and whose edges correspond to the edges of the structure 50, including those of polygons constituting each surface. The management apparatus 100, on the other hand, defines a point P for use in calculating characteristic quantities, in addition to the eight vertices of the structure 50. As will be described later, the second embodiment may place two or more such points. The following description refers to these additional points P as "reference points."

Referring to the example of FIG. 5, the management apparatus 100 adds one reference point P to the structure 50 and produces a graph 60a, taking the reference point P into account. Specifically, this graph 60a has an additional node P corresponding to reference point P in the structure 50 and eight additional edges drawn from that node P to the other eight nodes.

Figure 6:
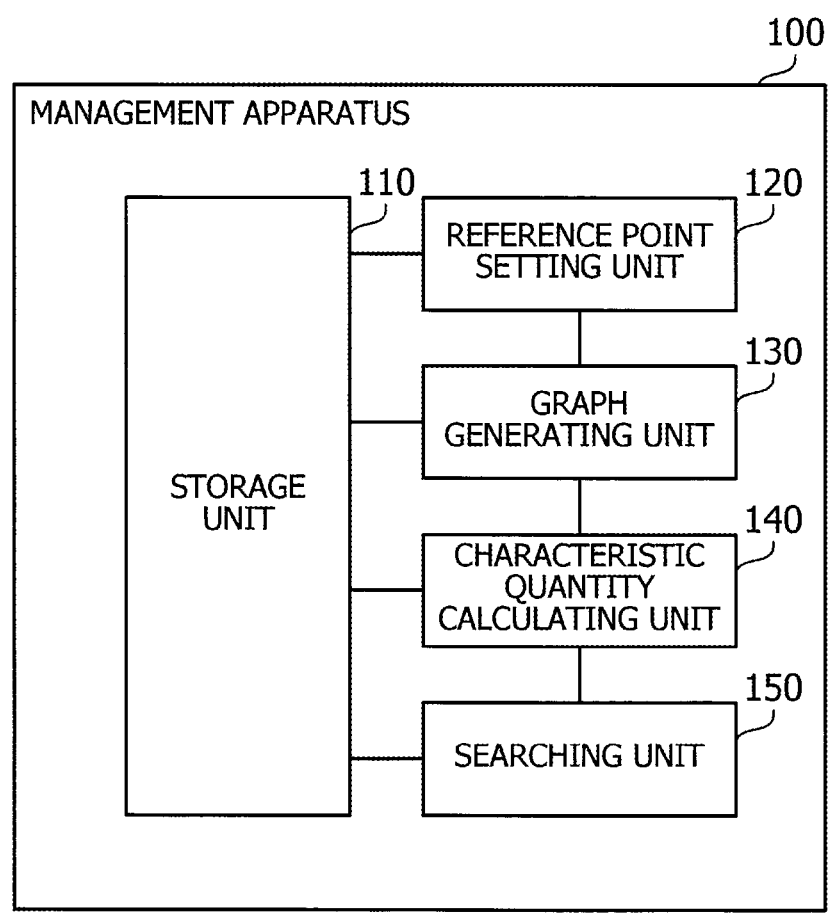
FIG. 6 illustrates an example of functional components implemented in the management apparatus of the second embodiment.

FIG. 6 illustrates an example of functional components implemented in the management apparatus of the second embodiment. The illustrated management apparatus 100 includes a storage unit 110, a reference point setting unit 120, a graph generating unit 130, a characteristic quantity calculating unit 140, and a searching unit 150. The reference point setting unit 120, graph generating unit 130, characteristic quantity calculating unit 140, and searching unit 150 may be implemented as program modules that the processor 101 is to execute.

The storage unit 110 stores data that the other components of the management apparatus 100 manipulate in their processing operations. The stored data includes STL datasets, a reference point table, graph data, and a characteristic vector table. STL dataset is a type of structure data representing the shape of a structure. The storage unit 110 stores an STL dataset for each structure that has been drafted and registered in the storage unit 110. In other words, the storage unit 110 contains multiple STL datasets. Where appropriate, the present description uses the term "library" to refer to those STL datasets stored in the storage unit 110. The reference point table is a collection of information for managing reference point coordinates of each structure. The graph data represents graphs produced from structure data and reference points. The characteristic vector table is a collection of information for managing characteristic vectors calculated from graph data of each structure. The management apparatus 100 has these pieces of data in its local storage unit 110, but the second embodiment is not limited by this configuration. Alternatively, all or part of the data may be stored in a remote storage device that is accessible to the management apparatus 100 via the network 10.

The reference point setting unit 120 calculates coordinates of reference points on the basis of data of polygons included in an STL dataset. In other words, it adds reference points to the STL dataset. According to the second embodiment, the reference point setting unit 120 calculates the center of mass of a structure of interest from its STL dataset, as well as performing a principal component analysis on a plurality of polygons defined in the STL dataset. The reference point setting unit 120 then determines the coordinates of each reference point on the basis of the calculated center of mass and the second (or higher degree) moment with respect to each principal component direction. The reference point setting unit 120 registers the calculated reference point coordinates in a reference point table 112 as a record relating to the STL dataset.

The graph generating unit 130 produces graph data on the basis of an STL dataset describing a structure and its reference point coordinates registered in the reference point table. For example, the graph data seen in FIG. 5 includes a node corresponding to one reference point P and a plurality of edges that connect the reference point P to each vertex of the structure.

The characteristic quantity calculating unit 140 calculates characteristic quantities that represent distinctive geometric features (shape) of a structure, by performing specific operations on the structure's graph data. There are some existing methods for this calculation of characteristic quantities. The characteristic quantity calculating unit 140 applies several types of operations to given graph data, thereby obtaining several different characteristic quantities for a single structure. These characteristic quantities form a characteristic vector. The characteristic quantity calculating unit 140 registers the characteristic vector of a structure in a characteristic vector table by adding a record relating to its STL dataset.

The searching unit 150 receives a search query for a specific structure. For example, the user may enter a search query to the management apparatus 100 by using input devices 12. The searching unit 150 may also be configured to receive search queries from other information processing apparatuses on the network 10. The received search query includes an STL dataset describing the shape of a structure specified by the user. The searching unit 150 obtains a characteristic vector of the STL dataset included in the search query by using the reference point setting unit 120, graph generating unit 130, and characteristic quantity calculating unit 140. Using the obtained characteristic vector as a search key, the searching unit 150 searches the characteristic vector table in the storage unit 110 for structures having a similar shape to the specified structure. When such structures are found, the searching unit 150 provides the search result to the requesting user by outputting it to the monitor 11 or sending it to the network.

FIG. 7 illustrates an example of an STL dataset used in the second embodiment, with line numbers placed on the left-hand side. The illustrated script format of this exemplary STL dataset 111 begins with a character string "solid" and an identifier "structure A" indicative of a specific structure as seen in line 1.

Line 2 declares a normal vector with a character string "facet normal" and its vector elements. The block from this "facet normal" (line 2) to "endfacet" (line 8) describes one polygon. Specifically, a polygon is defined by a number of lines each designating the coordinates (e.g., x1, y1, z1) of its vertex. Since the second embodiment uses triangles for modeling a structure, the STL data describes a polygon by specifying the coordinates of its three corners in three "vertex" lines.

As seen from the above, the STL dataset 111 provides a normal vector for distinguishing which surface of a polygon is its outer face. It is also possible to make the same distinction by checking the order of vertices appearing in the STL dataset 111. Line 9 and subsequent part of the STL dataset 111 define other polygons one by one. The STL dataset 111 ends with a character string "endsolid" as seen in line 15.

Figure 8:
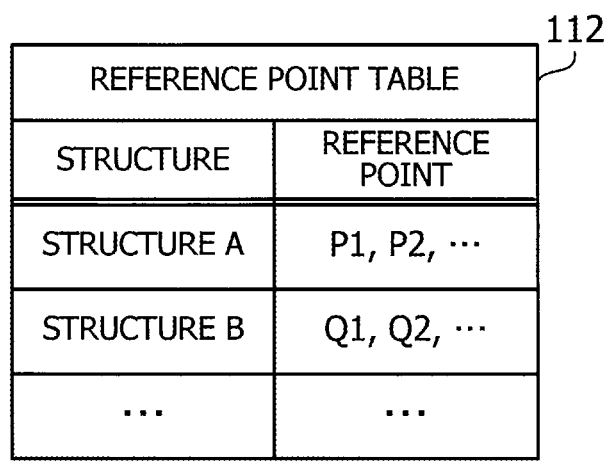
FIG. 8 illustrates an example of a reference point table used in the second embodiment.

FIG. 8 illustrates an example of a reference point table used in the second embodiment. The illustrated reference point table 112 is formed from two data fields named "Structure" and "Reference Point." The Structure field contains an identifier indicating a particular structure, and the Reference Point field gives the coordinates of each reference point of that structure.

For example, the topmost entry of the reference point table 112 contains a set of reference points P1, P2, and so on registered for a structure named "Structure A". The number of registered reference points per STL dataset is not limited by this specific example. The reference point field may contain only one reference point.

FIG. 9 illustrates an example of graph data produced in the second embodiment. It is assumed here that graph data 113 is stored in the GraphML format. GraphML describes nodes and edges of a graph by using the notation of Extensible Markup Language (XML). The second embodiment may, however, be configured to use other formats. While the second embodiment is also assumed to produce undirected graphs, directed graphs may still be an option. As will be described later, directed graphs are capable of expressing geometric features in a more distinct way. An example of graph data 113 is seen in FIG. 9, together with line numbers on its left side.

For example, line 3 defines a key ID "key0" for graph edges. When this key ID "key0" is specified in an edge-defining tag, it gives a particular "weight" attribute to the graph edge. The weight of a graph edge means, for example, the length of its corresponding polygon edge.

Line 4 defines another key ID "key1" for use with graph nodes. This key ID "key1" is used in a node tag to specify the state of a flag called "isReference." The isReference flag indicates whether the node corresponds to a reference point. More specifically, the node corresponds to a reference point when its isReference flag is set to true. The node corresponds to a non-reference point when its isReference flag is set to false.

The graph data 113 in FIG. 9 then defines node n0 in lines 7 to 9 and node n5 in lines 11 to 13, where "n0" and "n5" are node IDs. These nodes represent non-reference points because their tags including the key ID "key1" specify a value of "false" for their respective isReference flags. Lines 14 to 16, on the other hand, define node n6 corresponding to a reference point. That is, the isReference flag of node n6 is set to true.

The graph data 113 also includes edge definitions. For example, lines 17 to 19 defines an edge e0 between node n1 and node n0 with a weight of 1.5, where "e0" is an edge ID. Other edges are also defined in a similar way. Referring to lines 27 to 29, another edge e8 is defined between node n6 and node b5 with a weight of 14. As noted above, node n6 corresponds to a reference point. This means that edge e8 in the graph corresponds to an edge that connects one corner of the structure to the reference point.

Figure 10A:
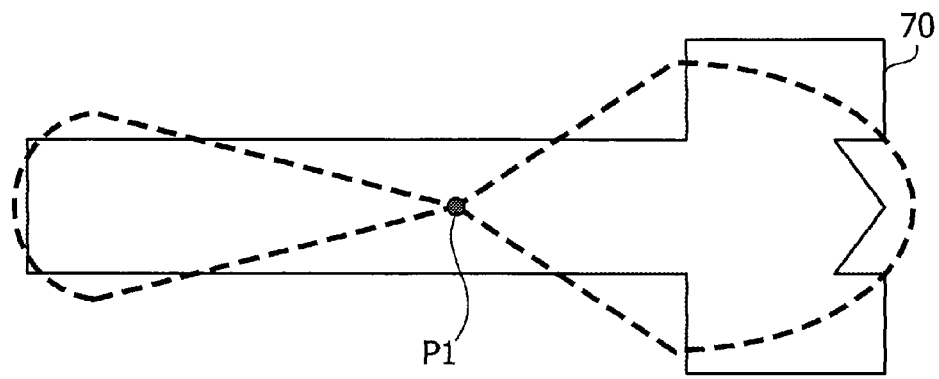
FIGS. 10A and 10B illustrate some examples of reference point setting in the second embodiment.
Figure 10B:
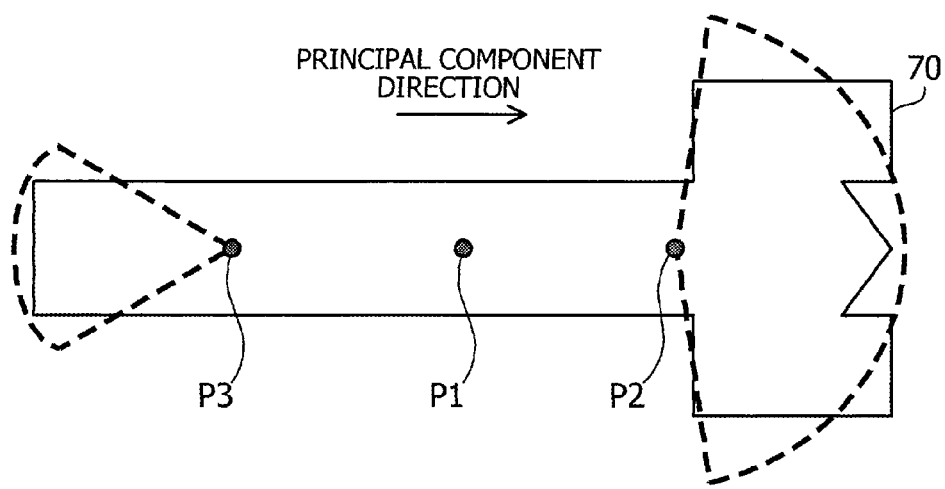

FIGS. 10A and 10B illustrate some examples of reference point setting in the second embodiment. FIG. 10A illustrates the case in which the center of mass of a structure 70 is selected as its reference point P1. FIG. 10B illustrates the case in which three reference points P1, P2, and P3 are set to the same structure 70 based on its center of mass and the second moment distributed in a principal component direction with respect to the center of mass.

More specifically, reference point P1 in FIG. 10B is placed at the center of mass as in the case of FIG. 10A. Other two reference points are then placed at the points that are apart from the center of mass in a principal component direction, with a distance being equal to standard deviation σ, i.e., the square root of average second moment (variance) along the principal-component direction. Specifically, let μ represent the coordinates of the center of mass (reference point P1) of a structure 70, and let h represent a unit vector in a principal-component direction of the structure 70. Reference point P2 is then set at one coordinate position μ+σh, and reference point P3 is set at another coordinate position μ−σh.

With the additional reference points P2 and P3, the resulting graph (not illustrated) emphasizes detailed features seen in the end portions of the structure 70, advantageously over the case in which only one reference point P1 is set at the center of mass of the structure 70. In other words, the graph represents the structure more clearly for the following reasons. The principal component directions of a structure indicate in which direction the structure spreads, and particularly the spread seen in the first principal component direction is greater than those in the second and third principal component directions. Referring to FIG. 10A, this example illustrates the case in which P1 at the center of mass is the only reference point of the structure 70. The broken lines indicate solid angles at reference point P1 toward two end portions of the structure 70 with respect to the illustrated principal component direction. These solid angles in FIG. 10A are relatively small, and the two end portions of the structure 70 are less distinguishable from each other in terms of differences in length between line segments (edge) drawn from reference point P1 to each corner of these end portions. This means that the resulting graph and characteristic vector could be less sensitive to the geometrical differences in these end portions of the structure 70.

In view of the above, the proposed management apparatus 100 places additional reference points P2 and P3 at two coordinate positions on both sides of the center of mass, each with an offset of σh, taking the standard deviation in the illustrated principal component direction as a spread of the structure in that direction. As seen from FIG. 10B, more significant differences are observed in the distance from reference point P2 to each vertex of its nearest end portion of the structure 70, compared with those in the case of reference point P1 alone. Similarly, more significant differences are observed in the distance from reference point P3 to each vertex of its nearest end portion of the structure 70, compared with those in the case of reference point P1 alone. These reference points P2 and P3 permit the resulting graph to represent geometric features of the structure 70 in greater detail.

The following description is directed to what processing operations the management apparatus 100 performs in the second embodiment. The description begins with a process that calculates characteristic vectors from STL datasets of existing structures and registers them in the storage unit 110 in preparation for later library search operation.

FIG. 11 is a flowchart illustrating an example of a vector registration process performed in the second embodiment. Each operation in FIG. 11 is described below in the order of step numbers.

(S11) The reference point setting unit 120 reads an STL dataset 111 out of the storage unit 110. It is noted that a plurality of STL datasets may be stored in the storage unit 110. Although it is not explicit in the flowchart of FIG. 11, steps S11 to S15 are repeated as many times as the number of available STL datasets.

(S12) The STL dataset 111 describes a spatial arrangement of polygons forming a structure. The reference point setting unit 120 calculates reference point coordinates from this polygon arrangement and adds a record to the reference point table 112 to register the calculated coordinates for the STL dataset 111. The details of this step will be described later.

(S13) Based on the STL dataset 111 and the reference point coordinates determined at step S12, the graph generating unit 130 produces a graph from the structure of interest and stores its graph data 113 in the storage unit 110.

(S14) The characteristic quantity calculating unit 140 calculates characteristic quantities of the structure by performing specific calculations on the graph data 113. The characteristic quantity calculating unit 140 actually performs several different calculations to obtain a plurality of characteristic quantities of different types. These characteristic quantities form a characteristic vector describing the structure.

(S15) The characteristic quantity calculating unit 140 registers the calculated characteristic vector in the storage unit 110 as another piece of information relating to the STL dataset 111.

Figure 12:
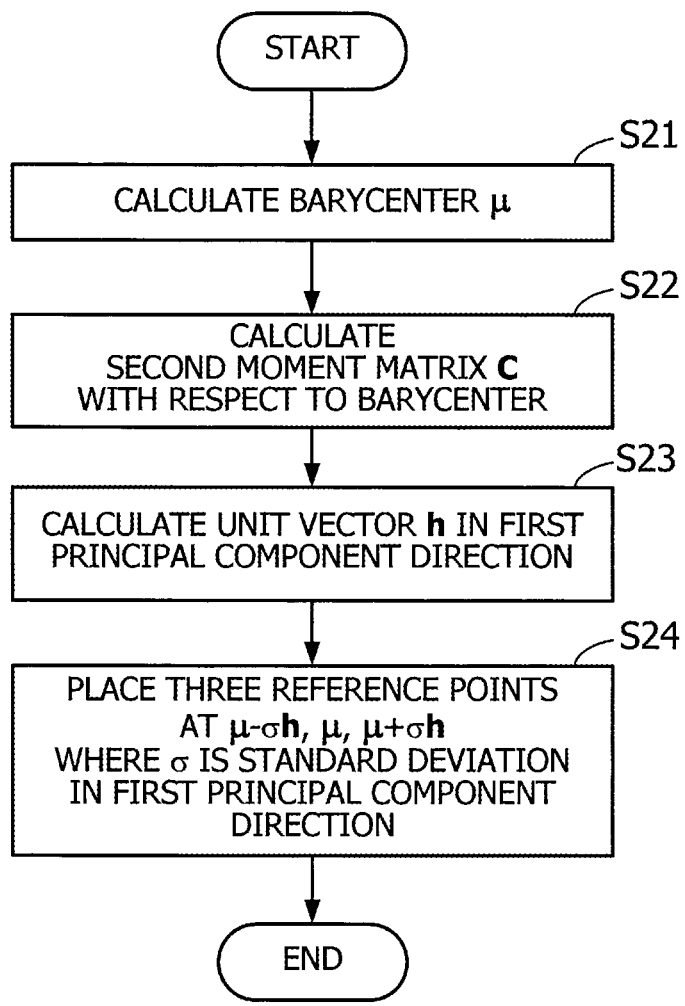
FIG. 12 is a flowchart illustrating an example of a reference point setting process performed in the second embodiment.

FIG. 12 is a flowchart illustrating an example of a reference point setting process performed in the second embodiment. Each operation in FIG. 12 is described below in the order of step numbers. It is noted that the flowchart of FIG. 12 provides the details of step S12 in FIG. 11. The following description uses bold symbols to represent vectors (including coordinates represented by position vectors) or matrixes. Vectors seen below are 3-by-1 column vectors (i.e., vectors with three rows and one column) unless they have a suffix "T" denoting "transpose." Vectors with a suffix "T" are 1-by-3 row vectors. The reference point setting unit 120 uses a technique of principal component analysis to select appropriate reference points.

(S21) The reference point setting unit 120 calculates the coordinates μ representing the center of mass of a structure that the given STL dataset 111 describes. More specifically, this is achieved by the following procedure. First think of a tetrahedron defined by three vertices of the i-th polygon and the origin O. The volume Vi of this i-th tetrahedron is expressed by formula (1).

$$V_i = \frac{p_3^T(p_1 \times p_2)}{6} \tag{1}$$

where $p_1$, $p_2$, and $p_3$ are position vectors representing three vertices of the i-th polygon with respect to the origin O.

As the structure of interest is made up of N polygons, the following formula (2) gives its entire volume V.

$$V = \sum_{i=1}^{N} V_i \tag{2}$$

Then the center of mass of the i-th tetrahedron is calculated as the coordinates $\eta_i$ given by formula (3), assuming that the structure is uniform in density.

$$\eta_i = \frac{p_1 + p_2 + p_3}{4} \tag{3}$$

Finally the coordinates $\mu$ representing the structure's center of mass is calculated with the following formula (4):

$$\mu = \frac{1}{V} \sum_{i=1}^{N} V_i \eta_i \tag{4}$$

(S22) The reference point setting unit 120 calculates a second moment matrix C (which may also be referred to as a covariance matrix) with respect to the coordinates $\mu$ representing the center of mass. This second moment matrix C is a 3-by-3 symmetric matrix that indicates, in the present embodiment, the deviation of vertices of multiple polygons in a three-dimensional space. Alternatively, the reference point setting unit 120 may take a different method to obtain a second moment matrix that indicates deviation in the centers of mass of multiple polygons (calculated from corner coordinates of each polygon) in a three-dimensional space. In either case, the matrix C permits the reference point setting unit 120 to evaluate non-uniformity of polygon distribution in the given space. Specifically, the following formula (5) gives a second moment matrix C.

$$C = \frac{1}{n} \sum_{j=1}^{n} (p_j - \mu)(p_j - \mu)^T \tag{5}$$

where n represents the total number of vertices of polygons included in the STL dataset 111, and $p_j$ represents a position vector indicating the j-th vertex out of all the n polygonal vertices. The following list (6) gives every element of the second moment matrix C, where vector $p_j^T = (x_j, y_j, z_j)$ and vector $\mu^T = (\mu_x, \mu_y, \mu_z)$.

$$\begin{cases} C_{11} = \frac{1}{n} \sum_{j=1}^{n} (x_j - \mu_x)^2 \\ C_{22} = \frac{1}{n} \sum_{j=1}^{n} (y_j - \mu_y)^2 \\ C_{33} = \frac{1}{n} \sum_{j=1}^{n} (z_j - \mu_z)^2 \\ C_{12} = C_{21} = \frac{1}{n} \sum_{j=1}^{n} (x_j - \mu_x)(y_j - \mu_y) \\ C_{13} = C_{31} = \frac{1}{n} \sum_{j=1}^{n} (x_j - \mu_x)(z_j - \mu_z) \\ C_{23} = C_{32} = \frac{1}{n} \sum_{j=1}^{n} (y_j - \mu_y)(z_j - \mu_z) \end{cases} \tag{6}$$

(S23) The reference point setting unit 120 calculates another second moment matrix in a new orthogonal coordinate system in which no correlation exists in the three axes. This is achieved by diagonalizing the second moment matrix C discussed above. More specifically, let X represent a matrix for coordinate conversion, and then the new second moment matrix $XCX^T$ is expressed in the following formula (7).

$$XCX^T = \begin{pmatrix} \lambda_1 & 0 & 0 \\ 0 & \lambda_2 & 0 \\ 0 & 0 & \lambda_3 \end{pmatrix} \tag{7}$$

where the three diagonal components $\lambda_1$, $\lambda_2$, and $\lambda_3$ ($\lambda_1 \geq \lambda_2 \geq \lambda_3$) are eigenvalues of the second moment matrix C. Eigenvectors of the second moment matrix C are obtained from respective eigenvalues $\lambda_1$, $\lambda_2$, and $\lambda_3$, which are unit vectors each indicating a principal component direction of the structure. More particularly, the eigenvector for $\lambda_1$ indicates the direction of the first principal component, representing the axis direction along which the structure exhibits the largest amount of non-uniformity. The eigenvector for $\lambda_2$ indicates the direction of the second principal component, and the eigenvector for $\lambda_3$ indicates the direction of the third principal component. These eigenvalues $\lambda_1$, $\lambda_2$, and $\lambda_3$ are obtained as the roots of a cubic characteristic equation (8).

$$\det(C - \lambda I) = 0 \tag{8}$$

where I represents a unit matrix.

The standard deviation in the first principal component direction is now calculated with formula (9). Further, the x, y, and z components of unit eigenvector h indicating the first principal component direction are calculated by solving a system of three linear equations (10) seen below.

$$\sigma = \sqrt{\lambda_1} \tag{9}$$

$$(C - \lambda_1 I)h = 0 \tag{10}$$

(S24) The reference point setting unit 120 determines three coordinate positions $\mu - \sigma h$, $\mu$, and $\mu + \sigma h$ as reference points for the given structure. The reference point setting unit 120 adds a new record to the reference point table 112 to register these reference points of the STL dataset 111.

The above steps permit the management apparatus 100 to set reference points for a given structure. Although the flowchart of FIG. 12 only exemplifies calculations for the direction of the first principal component, the management apparatus 100 may be configured to set reference points for the second and third principal component directions in a similar manner.

Figure 13:
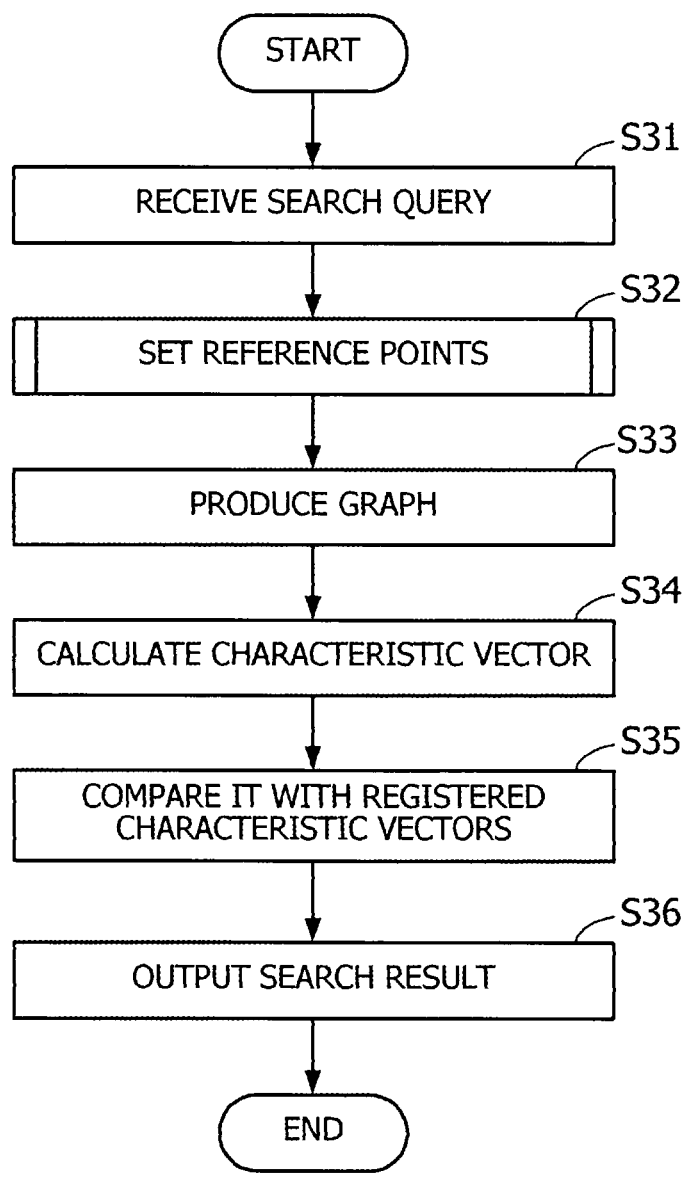
FIG. 13 is a flowchart illustrating an example of a searching process performed in the second embodiment.

FIG. 13 is a flowchart illustrating an example of a searching process performed in the second embodiment. Each operation in FIG. 13 is described below in the order of step numbers.

(S31) The searching unit 150 receives a search query including an STL dataset of a structure specified by the user. As mentioned previously, this search query may have been entered to the management apparatus 100 directly by the user or may have arrived from a remote device via a network 10.

(S32) Based on the STL dataset in the received search query, the reference point setting unit 120 determines reference points for the user-specified structure in the same way as discussed in FIG. 12.

(S33) Based on the STL dataset in the search query and the reference point coordinates determined at step S32, the graph generating unit 130 turns the user-specified structure into a graph, thus producing graph data.

(S34) The characteristic quantity calculating unit 140 calculates characteristic quantities of the user-specified structure by performing specific calculations on the graph data produced at step S33. The characteristic quantity calculating unit 140 actually performs several different calculations to obtain a plurality of characteristic quantities of different types, thus forming a characteristic vector describing the structure of interest.

(S35) The searching unit 150 compares the characteristic vector of step S34 with each registered characteristic vector in the storage unit 110, thereby identifying existing structures that resemble the user-specified structure in shape.

(S36) The searching unit 150 outputs the search result to, for example, a screen of the monitor 11. The searching unit 150 may also be configured to transmit search results to the requesting device via the network 10.

Figure 14:
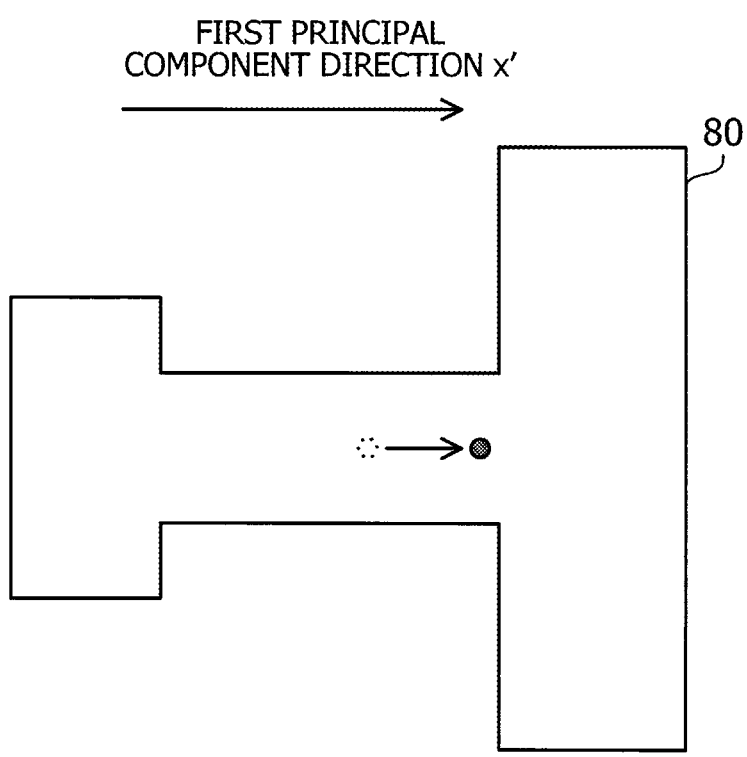
FIG. 14 illustrates yet another example of reference point setting in the second embodiment.

FIG. 14 illustrates yet another example of reference point setting in the second embodiment. While the foregoing description up to FIG. 13 has exemplified the way of setting reference points based primarily on the second moment, the proposed management apparatus 100 may calculate, for example, the third, fourth, or fifth moment for the same purpose. These alternatives to the second moment may be referred to as "higher-degree moments."

For example, let x' be the axis of the first principal component direction. The management apparatus 100 calculates an average $\lambda'$ of k-th moment on the x' axis with respect to the x' axis coordinate of the center of mass $\mu$, as seen in formula (11), where k is an integer greater than one. The next formula (12) then gives $\sigma_k$ for $\lambda'$.

$$\lambda' = \frac{1}{n}\sum_{j=1}^{n}(x'_j - \mu_{x'})^k \quad (11)$$

$$\sigma_k = \sqrt[k]{\lambda'} \quad (12)$$

Step S24 in the flowchart of FIG. 12 is now modified to set reference points at the coordinates $\mu-\sigma_k h$, and $\mu+\sigma_k h$, in addition to $\mu-\sigma h$ and $\mu+\sigma h$, or in place of $\mu-\sigma h$ and $\mu+\sigma h$. The method described above for the first principal component direction may similarly apply to the second and third principal component directions. For example, FIG. 14 illustrates a structure 80 whose polygons are concentrated at one end of the first principal component direction. The use of higher-degree moment is advantageous in this case since the resulting reference point comes closer to that end of the structure 80, meaning that more detailed geometric features of the structure 80 can be reflected in its graph.

As seen from the above description, the proposed management apparatus 100 not only places a reference point at the center of mass of a structure 80, but also sets more reference points on the basis of non-uniformity in polygon distribution of the structure 80. These additional reference points enable the resulting graph to reflect geometric features of the structure 80 in more detail.

The above-described management apparatus 100 produces an undirected graph for subsequent calculation of characteristic quantities. The second embodiment may, however, be modified to produce a directed graph. For example, a directed edge is drawn in a graph to represent a line segment that connects a vertex of the structure and a reference point, such that the direction of the edge indicates whether the vertex in question is at the top of a convex portion (protrusion) of the structure or at the bottom of a concave portion (recess) of the structure.

More specifically, the management apparatus 100 achieves the above by calculating an inner product of a vector $\mu$ representing the structure's center of mass and a normal vector representing each polygon that shares the vertex in question. The resulting inner product values may include positive ones and negative ones. If the number of positive ones is greater than or equal to the number of negative ones, then the vertex in question is determined to be at the top of a protrusion of the structure. The management apparatus 100 now draws a directed edge in the structure's graph from the reference point node to the node representing the vertex in question. On the other hand, if the negative ones outnumber the positive ones, then the vertex in question is determined to be at the bottom of a recess in the structure. The management apparatus 100 thus draws a directed edge in the structure's graph from the node representing the vertex in question to the reference point node.

The second embodiment and its variations have been described above. As can be seen from the description, it is possible to enhance the way of turning a given structure into a graph such that more detailed features of protrusions and recesses may be reflected in the graph and thus in the characteristic quantities calculated from the graph.

(c) Third Embodiment

This section describes a third embodiment with the focus on its features that distinguish the third embodiment from the foregoing second embodiment, while relying on the description in preceding sections for their common elements and operations. The third embodiment places a reference point at the center of mass as in the second embodiment. But the third embodiment is different from the second embodiment in that it gives some amount of shift to that reference point.

The exemplary hardware and software configuration of the management apparatus 100 discussed in the second embodiment similarly applies to the third embodiment. The following description thus inherits the reference numerals and element names from the second embodiment.

Figure 15:
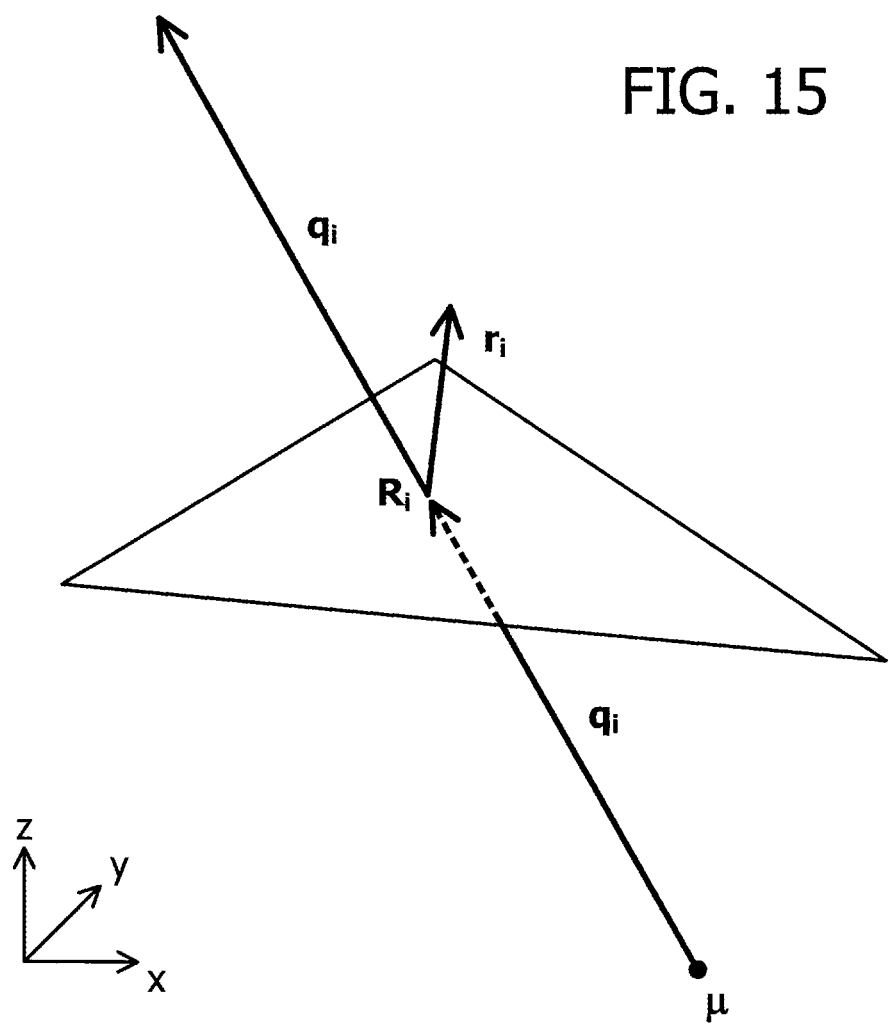
FIG. 15 illustrates an example of vectors relating to a polygon in a third embodiment.

FIG. 15 illustrates an example of vectors relating to a polygon in the third embodiment. The i-th polygon of a structure has its center of mass $R_i$ (which may also be referred to as the barycenter or centroid). The coordinates of the center of mass Ri are obtained by adding up three position vectors representing the vertices of the i-th polygon and dividing the resulting vector sum by 3. Vector $q_i$ is then obtained as $(R_i-\mu)$, where $\mu$ is a position vector representing the center of mass of the entire structure. That is, vector $q_i$ is drawn from the structure's center of mass $\mu$ to the i-th polygon's center of mass $R_i$.

Figure 16:
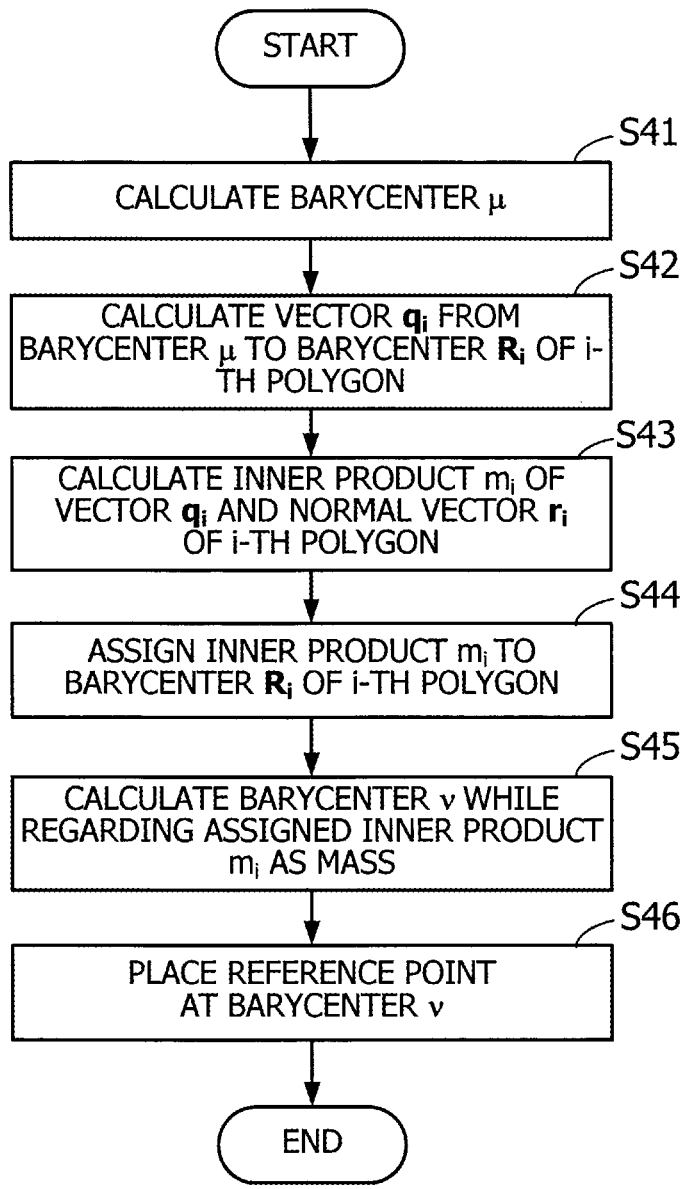
FIG. 16 is a flowchart illustrating an example of a reference point setting process performed in the third embodiment.

FIG. 16 is a flowchart illustrating an example of a reference point setting process performed in the third embodiment. This process corresponds to step S12 in FIG. 11 and step S32 in FIG. 13 alike. Each operation in FIG. 16 is described below in the order of step numbers.

(S41) The reference point setting unit 120 calculates coordinates of the center of mass $\mu$ of the structure from its STL dataset 111. See step S21 in FIG. 12 for the method of this calculation.

(S42) The reference point setting unit 120 calculates a vector $q_i$ that is directed from the structure's center of mass $\mu$ to the center of mass $R_i$ of the i-th polygon. The reference point setting unit 120 executes this calculation of vector $q_i$ for every polygon constituting the structure.

(S43) The reference point setting unit 120 calculates an inner product $m_i$ of vector $q_i$ and normal vector $r_i$ of the i-th polygon as seen in the following formula (13).

$$m_i = r_i \cdot q_i \quad (13)$$

(S44) The reference point setting unit 120 gives this inner product $m_i$ to the center of mass $R_i$ of the i-th polygon.

(S45) The reference point setting unit 120 calculates coordinates $v$ representing the center of mass of the structure, while regarding the above-assigned inner product $m_i$ as the mass of the i-th polygon. The calculation of $v$ assumes that the structure has a hollow body. In other words, the structure is treated as if its mass exists only at the centers of mass $R_i$ of N polygons that constitute the structure's surfaces. Under this assumption, the following formula (14) gives the mass of the structure.

$$M = \sum_{i=1}^{N} m_i \quad (14)$$

Accordingly the coordinates $v$ of the structure's center of mass is expressed as formula (15).

$$v = \frac{1}{M} \sum_{i=1}^{N} m_i R_i \quad (15)$$

The coordinates $v$ are supposed to reflect the distribution of inner products $m_i$ within the three-dimensional space. Since the inner products $m_i$ have been each assigned to the center of mass of the corresponding i-th polygon, their distribution depends on the three-dimensional arrangement of the polygons.

(S46) The reference point setting unit 120 places a reference point at the coordinates $v$ of the center of mass that have been calculated at step S45. The reference point setting unit 120 registers the reference point coordinates in the reference point table 112 as a record relating to the STL dataset 111.

Figure 17:
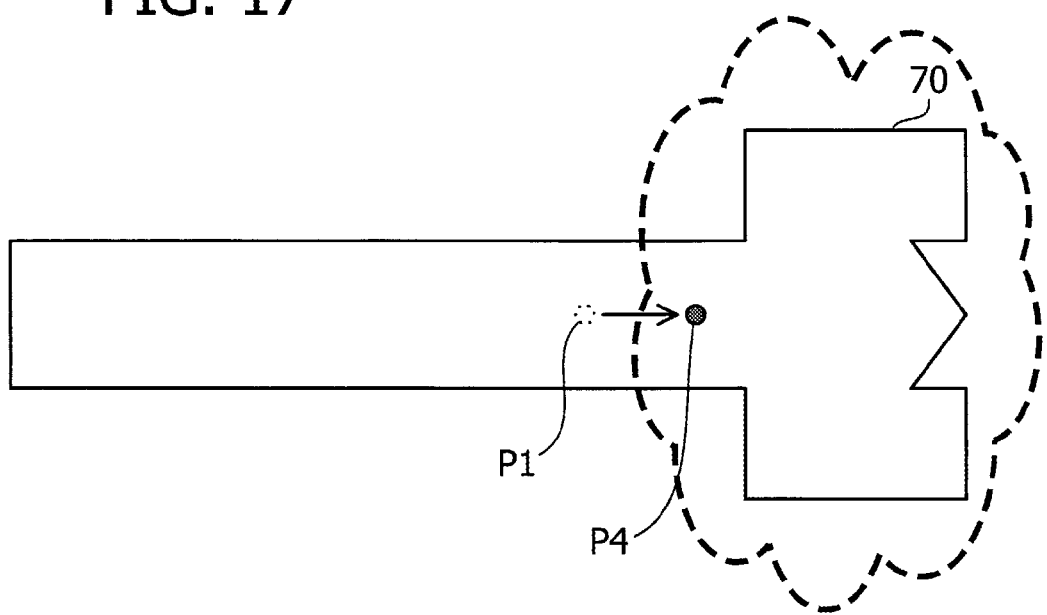
FIG. 17 illustrates an example of reference point setting in the third embodiment.

FIG. 17 illustrates an example of reference point setting in the third embodiment. As described above, the third embodiment calculates an inner product $m_i$ for each polygon and gives $m_i$ to its center of mass, so that the structure's center of mass $v$ is obtained on the basis of the assigned inner products. The center of mass $v$ obtained in this way has some offset from the conventional center of mass $\mu$ (or reference point P1 in the second embodiment) of the same structure. More specifically, the distribution of inner products $m_i$ depends, not on the size of polygons, but on the number of polygons in a space. That is, the values of inner products tend to be high in a region containing a relatively large number of polygons. More particularly, the structure may have a region that is populated with many outward polygons (i.e., those facing outward when viewed from the structure's original center of mass $\mu$). The method proposed in the third embodiment places a reference point P4 in such a region or near such a region, thus making it possible to produce a graph that reflects the shape of protruding portions of a structure (e.g., an enlarged end of the structure 70) in more detail.

(d) Fourth Embodiment

This section describes a fourth embodiment with the focus on its features that distinguish the fourth embodiment from the foregoing second and third embodiments, while relying on the description in preceding sections for their common elements and operations. The fourth embodiment is designed to find a portion with a relatively high polygon density in a given structure. Here the term "polygon density" refers to a quotient of the number of centers of mass contained in a sphere with a specific radius, divided by the volume of the sphere. The management apparatus 100 seeks a portion having a relatively high polygon density by using a local search algorithm (e.g., hill climbing method).

The exemplary hardware and software configuration of the management apparatus 100 discussed in the second embodiment similarly applies to the fourth embodiment. The following description thus inherits the reference numerals and element names from the second embodiment.

Figure 18:
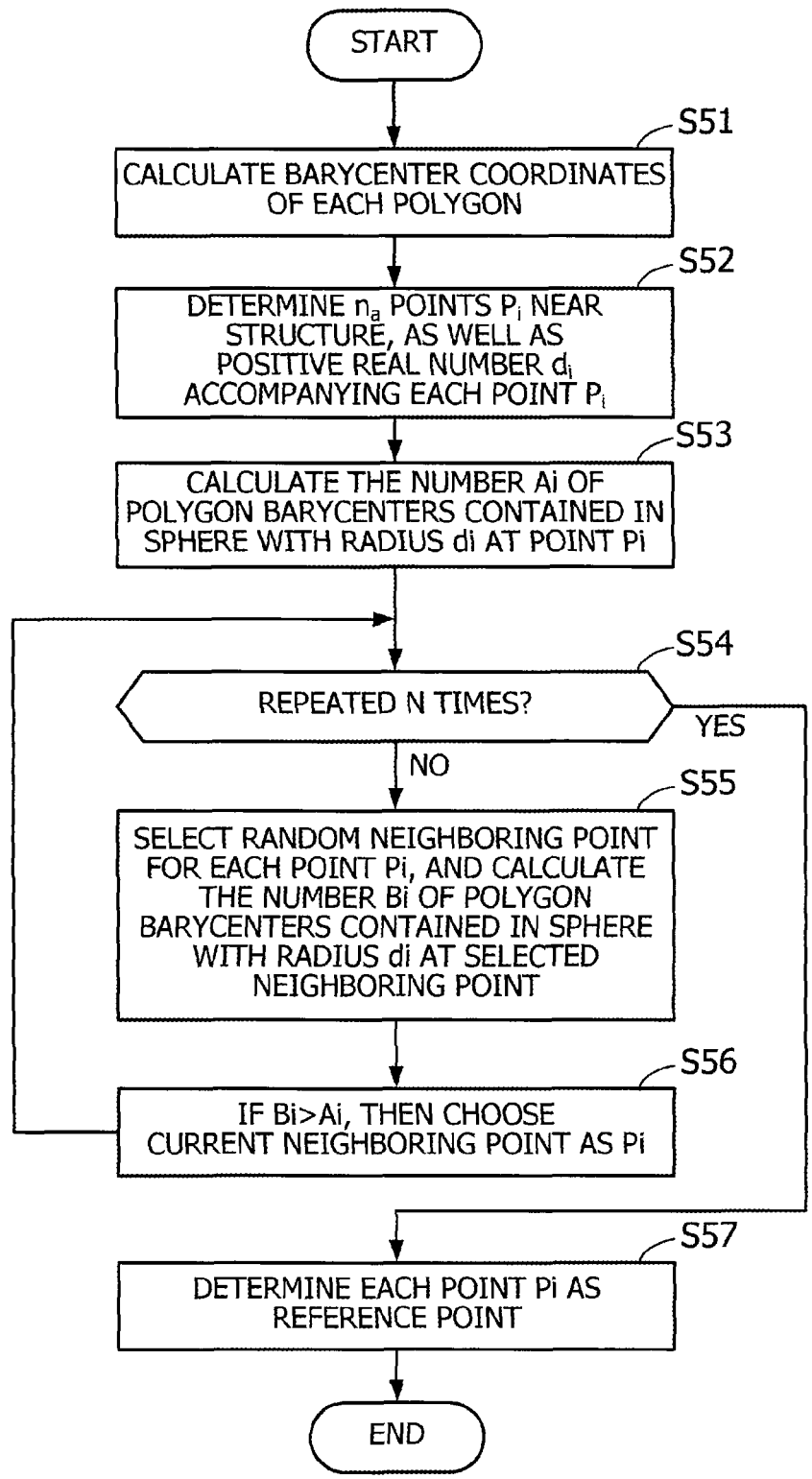
FIG. 18 is a flowchart illustrating an example of a reference point setting process performed in a fourth embodiment.

FIG. 18 is a flowchart illustrating an example of a reference point setting process performed in the fourth embodiment. This process corresponds to step S12 in FIG. 11 and step S32 in FIG. 13 alike. Each operation in FIG. 18 is described below in the order of step numbers.

(S51) The reference point setting unit 120 calculates the coordinates of the center of mass of each polygon constituting the given structure.

(S52) The reference point setting unit 120 determines a plurality ($n_a$) of points $P_i$ near the structure, as well as a positive real number $d_i$ accompanying each point $P_i$, where $n_a$ is an integer greater than zero, and i is an integer in the range from one to $n_a$. For example, this step S52 is done by the following procedure. The reference point setting unit 120 first determines the center of mass $\mu$ of the structure and calculates a standard deviation $\sigma$ with respect to principal component directions, as discussed previously in the second embodiment. Then it sets a neighboring space of $\mu \pm \sigma$ for the structure and places a number $n_a$ of points $P_i$ in that neighboring space by using, for example, random numbers. Because $\sigma$ is obtained for each of the three principal components, the noted neighboring space has an ellipsoidal shape. The reference point setting unit 120 may determine real numbers $d_i$ by sampling their values from a Gaussian distribution with a mean of (square root of $\lambda_1$) divided by 100 and a standard deviation of (square root of $\lambda_1$) divided by 10. Alternatively, the reference point setting unit 120 may place a spherical neighboring space with a predetermined radius around the center of mass $\mu$ and use predetermined values as the real numbers $d_i$.

(S53) The reference point setting unit 120 counts the number $A_i$ of polygonal centers of mass contained in a sphere with a radius of $d_i$ whose center is located at point $P_i$.

(S54) The reference point setting unit 120 determines whether it has repeated steps S55 and S56 N times, where N is a number that is previously given to the reference point setting unit 120. When the repetitions have reached N, the process exits from the loop and proceeds to step S57. When N is not reached, the process advances to step S55.

(S55) For each point $P_i$, the reference point setting unit 120 selects its neighboring point by using random numbers. For example, a neighboring point is selected randomly within a predetermined distance from point $P_i$. The reference point setting unit 120 then counts the number $B_i$ of polygonal centers of mass contained in the sphere with a radius of $d_i$ whose center is located at the neighboring point.

(S56) If $B_i > A_i$, the reference point setting unit 120 chooses the neighboring point selected at step S55 as an alternative for point $P_i$. In other words, the current coordinates of $P_i$ are replaced with those of the neighboring point. If $B_i \le A_i$, the reference point setting unit 120 does nothing. The process then returns to step S54.

(S57) The reference point setting unit 120 determines each point $P_i$ as a reference point. The reference point setting unit 120 registers the coordinates of these reference points in the reference point table 112 as a record for the STL dataset 111.

Figure 19:
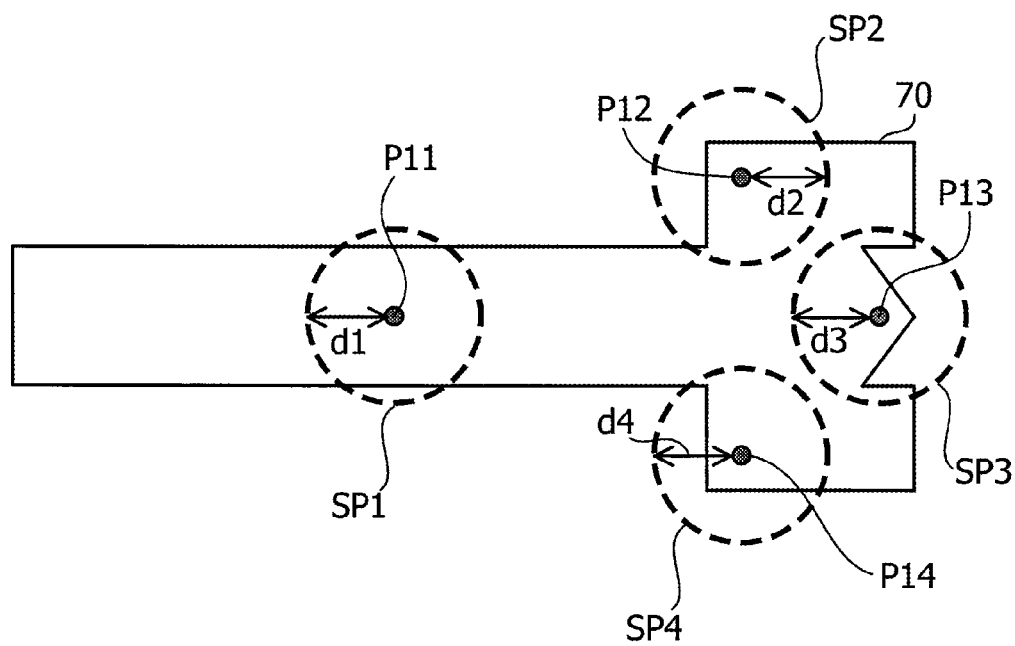
FIG. 19 illustrates an example of reference point setting in the fourth embodiment.

FIG. 19 illustrates an example of reference point setting in the fourth embodiment. According to the fourth embodiment, the reference point setting unit 120 gives an initial center position and an initial radius to each sphere SP1, SP2, SP3, and SP4 and seeks a new position with a high polygon density by using a local search algorithm (e.g., hill climbing method). Referring to the example of FIG. 19, point P11 represents the center of one sphere SP1. Point P12 represents the center of another sphere SP2. Point P13 represents the center of yet another sphere SP3. Point P14 represents the center of still another sphere SP4. These spheres SP1, SP2, SP3, and SP4 have their respective radiuses d1, d2, d3, and d4.

The number of centers of mass of polygons in a sphere with a constant radius may depend on where the sphere is positioned. Suppose, for example, that the reference point setting unit 120 has found a position at which sphere SP3 will contain more centers of mass (meaning a higher polygon density). The reference point setting unit 120 then moves the center of sphere SP3 to that higher-density position. This is repeated with each sphere. As discussed previously, a relatively high polygon density observed in a portion of a structure suggests that the structure has a distinctive convex or concave shape in that particular portion. Such portions (e.g., spheres SP1, SP2, SP3, and SP4 in FIG. 19) are the right places for setting reference points, since the resulting graph is expected to reflect geometric features of the structure in more detail.

(e) Fifth Embodiment

This section describes a fifth embodiment with the focus on its features that distinguish the fifth embodiment from the foregoing second to fourth embodiments, while relying on the description in preceding sections for their common elements and operations. The fifth embodiment is designed to change the way of setting reference points, depending on the intention of search queries.

The exemplary hardware and software configuration of the management apparatus 100 discussed in the second embodiment similarly applies to the fifth embodiment. The following description thus inherits the reference numerals and element names from the second embodiment.

The management apparatus 100 of the fifth embodiment previously calculates some different types of characteristic vectors with different arrangement of reference points, and stores them in the storage unit 110 for registered STL datasets in the library. FIG. 20 illustrates an example of a characteristic vector table used in the fifth embodiment. The illustrated characteristic vector table 114 in the storage unit 110 includes the following data fields: "Structure," "Pattern 1 (Second Moment)," "Pattern 2 (Barycenter v)," and "Pattern 3 (Polygon Density)."

The Structure field contains an identifier that indicates a specific structure. The Pattern 1 (Second Moment) field contains a characteristic vector that has been calculated with the method discussed in the second embodiment. The Pattern 2 (Barycenter v) field contains a characteristic vector that has been calculated with the method discussed in the third embodiment. The Pattern 3 (Polygon Density) field contains a characteristic vector that has been calculated with the method discussed in the fourth embodiment.

For example, the characteristic vector table 114 of FIG. 20 contains a record of a structure named "Structure A" in which a pattern-1 characteristic vector "V11," a pattern-2 characteristic vector "V12," and a pattern-3 characteristic vector "V13" are registered. These characteristic vectors have previously been calculated by applying the methods discussed in the second, third, and fourth embodiments to the existing STL dataset of Structure A.

The management apparatus 100 selectively uses those characteristic vectors depending on what is to be searched for. That is, the management apparatus 100 parses the content of a received search query to identify the intention of the requesting user. For example, the user is allowed to send a search query to the management apparatus 100, not only specifying an STL dataset having a desired shape, but also designating his or her intention as to whether to seek a structure that resembles the specified structure in overall aspect or in some particular aspect.

Figure 21:
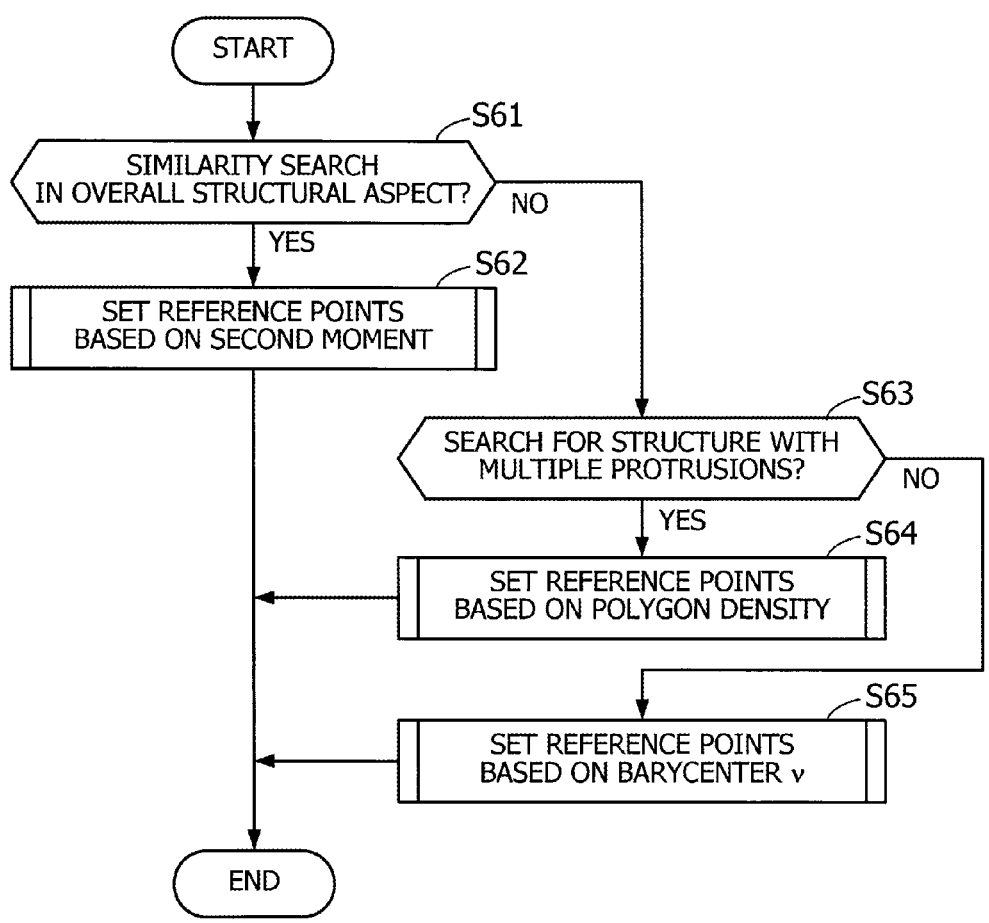
FIG. 21 is a flowchart illustrating an example of a reference point setting process performed in the fifth embodiment.

FIG. 21 is a flowchart illustrating an example of a reference point setting process performed in the fifth embodiment. This process corresponds to step S32 in FIG. 13. Each operation in FIG. 21 is described below in the order of step numbers.

(S61) The reference point setting unit 120 parses a received search query to identify its intention. Specifically, the reference point setting unit 120 determines whether the search query is directed to a similarity search for other structures that resemble the desired structure in overall aspect. If the search query in question is directed to such an overall similarity search, the process advances to step S62. If not, the process proceeds to step S63.

(S62) Based on the STL dataset in the search query, the reference point setting unit 120 sets reference points in the specified structure according to its second moment distribution (Pattern 1). This processing may be done in the way previously discussed in FIG. 12 for the second embodiment. It is also possible to use the third moment or those of higher degrees, instead of the second moment, as mentioned in the second embodiment. When this is the case, the characteristic vector table 114 in FIG. 20 contains characteristic vectors that have previously been calculated from reference points determined according to the third or higher-degree moment. The reference point setting unit 120 terminates the present process when this step S62 is done.

(S63) The reference point setting unit 120 determines whether the search query is intended for structures that have multiple protrusions. If the search query in question is intended for such structures, the process advances to step S64. If not, the process proceeds to step S65.

(S64) Based on the STL dataset in the search query, the reference point setting unit 120 sets reference points in the specified structure according to its polygon density distribution (Pattern 3). This processing may be done in the way previously discussed in FIG. 18 for the fourth embodiment. The reference point setting unit 120 terminates the present process when step S64 is done.

(S65) Based on the STL dataset in the search query, the reference point setting unit 120 sets reference points in the specified structure according to its center of mass v (Pattern 2). This processing may be done in the way previously discussed in FIG. 16 for the third embodiment. The reference point setting unit 120 terminates the present process when this step S65 is done.

Subsequently to the above, the graph generating unit 130 and characteristic quantity calculating unit 140 form the specified structure into a graph and calculate a characteristic vector (see steps S33 and S34 in FIG. 13) on the basis of the STL dataset in the search query and the reference points that the reference point setting unit 120 has set in the process of FIG. 21. The reference point setting unit 120 further informs the searching unit 150 which pattern it has selected in the course of setting those reference points.

The searching unit 150, now at step S35 in FIG. 13, consults the characteristic vector table 114 to retrieve characteristic vectors registered for the selected pattern. Then the searching unit 150 compares each retrieved characteristic vector with the characteristic vector calculated from the search query.

As can be seen from the above description, reference points may be determined in different ways, and different characteristic vectors may be produced from the same structure, depending on what the received search query is intended for. In the case of, for example, a similarity search for a structure as a whole, the management apparatus 100 relies on the geometric features in principal-component directions to find structures that resemble the specified structure in overall aspect. As another example, think of searching for structures having two or more protrusions. Since those protrusions are supposed to manifest their distinct features as higher densities of polygons, the management apparatus 100 uses the method discussed in the fourth embodiment to place reference points so as to maintain the protrusive features. The management apparatus 100 then executes a search on the basis of such features, thus finding proper structures having multiple protrusions. For other kinds of search queries, the method proposed in the third embodiment is used because of its balanced attention on overall structure and partial structure.

The choice of how to set reference points may depend on other things than the search intentions discussed above. For example, it is possible to select an appropriate method according to the type of objects to be searched for.

Figure 22:
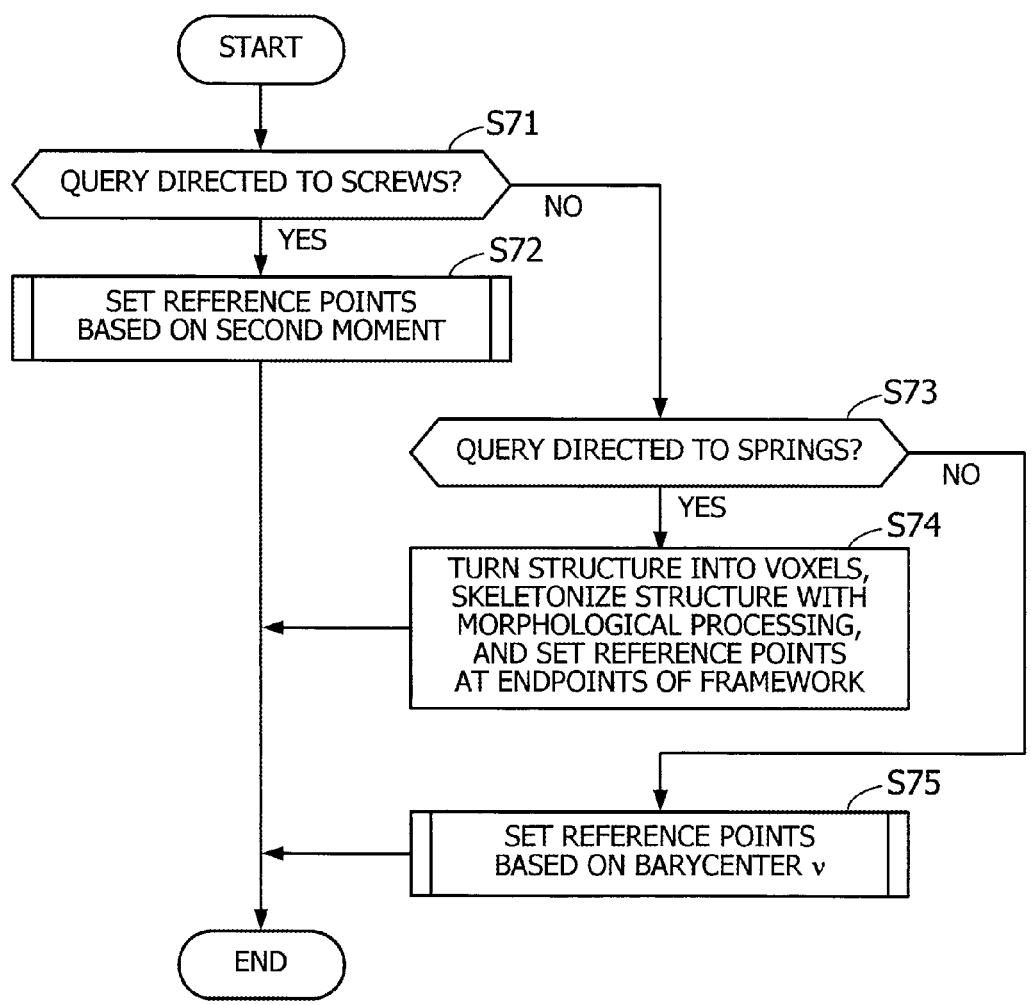
FIG. 22 is a flowchart illustrating another example of a reference point setting process performed in the fifth embodiment.

FIG. 22 is a flowchart illustrating another example of a reference point setting process performed in the fifth embodiment. This process corresponds to step S32 in FIG. 13. Each operation in FIG. 22 is described below in the order of step numbers.

(S71) The reference point setting unit 120 identifies to what type of objects the received search query is directed. (The type of objects may be considered as another example of search intentions.) More specifically, the reference point setting unit 120 determines whether the search query is directed to screws. When screws are sought, the process advances to step S72. When other objects are sought, the process proceeds to step S73.

(S72) Based on the STL dataset in the search query, the reference point setting unit 120 sets reference points in the specified structure according to its second moment distribution (Pattern 1). This processing may be done in the way previously discussed in FIG. 12 for the second embodiment. It is also possible to use the third moment or those of higher degrees, instead of the second moment, as mentioned in the second embodiment. When this is the case, the characteristic vector table 114 contains characteristic vectors that have previously been calculated from reference points determined according to the third or higher-degree moment. The reference point setting unit 120 terminates the present process when this step S72 is done.

(S73) The reference point setting unit 120 determines whether the search query is directed to springs. When springs are sought, the process advances to step S74. When other objects are sought, the process proceeds to step S75.

(S74) Based on the STL dataset in the search query, the reference point setting unit 120 turns the specified structure (spring) into voxels and then performing morphological operations on them to skeletonize the structure. Reference points are placed at endpoints of the resulting thin framework representing the structure. The reference point setting unit 120 terminates the present process when this step S74 is done.

(S75) Based on the STL dataset in the search query, the reference point setting unit 120 sets reference points in the specified structure according to its center of mass v (Pattern 2). This processing may be done in the way previously discussed in FIG. 16 for the third embodiment. The reference point setting unit 120 terminates the present process when this step S75 is done.

Subsequently to the above, the graph generating unit 130 and characteristic quantity calculating unit 140 form the specified structure into a graph and calculate a characteristic vector (see steps S33 and S34 in FIG. 13) on the basis of the STL dataset in the search query and the reference points that the reference point setting unit 120 has set in the process of FIG. 22. The reference point setting unit 120 further informs the searching unit 150 which pattern it has selected in the course of setting those reference points.

The searching unit 150, now at step S35 in FIG. 13, consults the characteristic vector table 114 to retrieve characteristic vectors corresponding to the selected pattern. Then the searching unit 150 compares each retrieved characteristic vector with the characteristic vector calculated from the search query. It is noted that the characteristic vector table 114 contains additional characteristic vectors that the management apparatus 100 calculated previously for the existing structures, assuming the pattern described in step S74.

For example, the above management apparatus 100 handles a search query for screws. Since the head and longitudinal axis are principal elements of screws, it sets reference points for a screw by selecting a proper method for placing them closer to the head and axis of the screw. The resulting characteristic vector represents distinctive features of the screw in more detail, thus enabling an accurate search of screw structures.

Figure 23A:
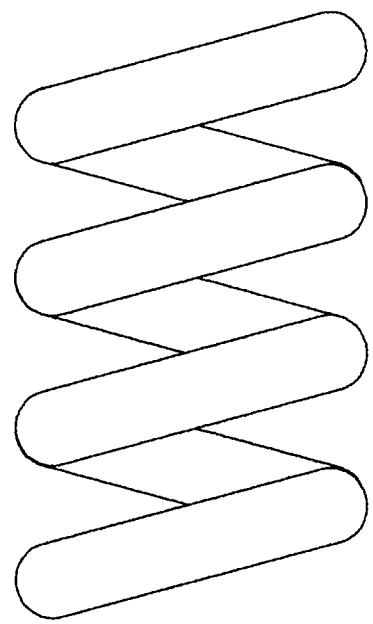
FIGS. 23A and 23B illustrate another example of reference point setting in the fifth embodiment.
Figure 23B:
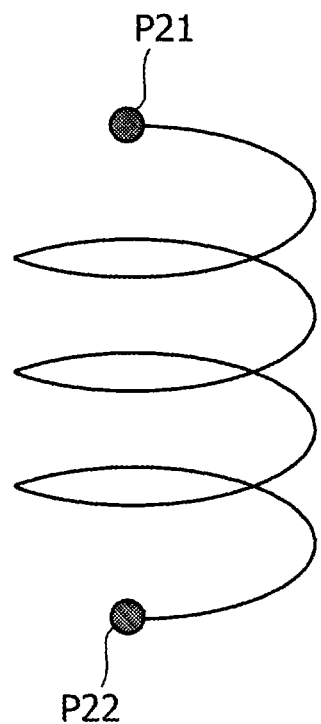

FIGS. 23A and 23B illustrate another example of reference point setting in the fifth embodiment. Specifically, FIGS. 23A and 23B demonstrate what the reference point setting unit 120 does at step S74 in FIG. 22. That is, FIG. 23A depicts the original state of a spring structure. FIG. 23B illustrates the same spring structure, but after reduction into a thin line model, with two reference points P21 and P22 set at the upper and lower ends of that model.

The spring structure has a hollow around its longitudinal center line, and that hollow contains the structure's center of mass. In other words, the center of mass does not lie in the solid inside of the spring structure. For this reason, the reference point setting unit 120 sets reference points after thinning the spring structure down to a skeleton. The resulting characteristic vectors precisely reflect the column-like shape of the spring, which enables a more accurate search of spring structures.

When the search query is directed to other structures than screws and springs, the reference point setting unit 120 applies the method discussed in the third embodiment, just as in the process of FIG. 21, because it permits a search with balanced attention on overall structure and partial structure. The proposed management apparatus 100 thus selects an appropriate way of setting reference points, depending on the intention of search queries (including the type of objects that are sought) and executes a search with characteristic vectors calculated accordingly. These features of the fifth embodiment enable a more accurate search of structures.

The data processing operations discussed in the first embodiment may be implemented as a program executed by the computation unit 1b. Similarly the data processing operations discussed in the second to fifth embodiments may be implemented as a program executed by the processor 101. These programs may be recorded on a non-transitory computer-readable storage medium (e.g., storage medium 13 seen in FIG. 2).

For example, programs may be circulated in the form of storage media 13 containing program files. It is also possible to distribute programs from one computer to other computers via a network. A computer may read programs from a storage medium 13 or download the same from another computer and install them in its local storage device (e.g., RAM 102 or HDD 103) for execution by the processor.

The first to fifth embodiments have been described above. In one aspect of the embodiments, the proposed techniques make it possible to obtain the coordinates of points that are used in a search of structure data.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A non-transitory computer-readable storage medium storing a program that causes a computer to perform a procedure comprising:

calculating coordinates of a point with reference to structure data that includes coordinates of vertices of a plurality of polygons representing a three-dimensional structure;

storing the calculated coordinates of the point in a memory device as a piece of information relating to the structure data;

producing a graph including graph nodes corresponding to the point and vertices of the three-dimensional structure, first graph edges corresponding to structure edges connecting the vertices of the three-dimensional structure, and second graph edges corresponding to other edges connecting the point to the vertices of the three-dimensional structure;

acquiring characteristic quantities of the structure data based on the produced graph; and searching for a first three-dimensional structure similar to a second three-dimensional structure specified in a search query by comparing first characteristic quantities corresponding to the first three-dimensional structure with second characteristic quantities corresponding to the second three-dimensional structure, wherein the calculating coordinates is performed based on second-degree moment of inertia of the three-dimensional structure, with respect to a center of mass and a principal component direction of the three-dimensional structure.

2. The non-transitory computer-readable storage medium according to claim 1, wherein:

the procedure further includes receiving the search query that includes information indicating an intention of the search query; and the calculating coordinates includes selecting one of different methods for the calculating coordinates, depending on the intention of the search query.

3. The non-transitory computer-readable storage medium according to claim 2, wherein:

the calculating coordinates is performed upon receipt of the search query by using the one of different methods that is selected depending on the specified intention of the search query.

4. The non-transitory computer-readable storage medium according to claim 1, wherein the procedure further includes:

producing the graph with reference to the memory device by weighting the first graph edges according to lengths of the structure edges corresponding thereto and the second graph edges according to lengths of the other edges corresponding thereto; and calculating the characteristic quantities based on the produced graph.

5. A non-transitory computer-readable storage medium storing a program that causes a computer to perform a procedure comprising:

calculating coordinates of a point with reference to structure data that includes coordinates of vertices of a plurality of polygons representing a three-dimensional structure;

storing the calculated coordinates of the point in a memory device as a piece of information relating to the structure data;

producing a graph including graph nodes corresponding to the point and vertices of the three-dimensional structure, first graph edges corresponding to structure edges connecting the vertices of the three-dimensional structure, and second graph edges corresponding to other edges connecting the point to the vertices of the three-dimensional structure;

acquiring characteristic quantities of the structure data based on the produced graph; and searching for a first three-dimensional structure similar to a second three-dimensional structure specified in a search query by comparing first characteristic quantities corresponding to the first three-dimensional structure with second characteristic quantities corresponding to the second three-dimensional structure, wherein the calculating coordinates includes:
calculating an inner product between the normal vector of each polygon and a vector from the center of mass of the three-dimensional structure to the center of mass of said each polygon, and assigning the calculated inner product to the center of mass of said each polygon; and
calculating the coordinates of the point based on a distribution of the inner products assigned to the polygons.

6. A non-transitory computer-readable storage medium storing a program that causes a computer to perform a procedure comprising:
calculating coordinates of a point with reference to structure data that includes coordinates of vertices of a plurality of polygons representing a three-dimensional structure;
storing the calculated coordinates of the point in a memory device as a piece of information relating to the structure data;
producing a graph including graph nodes corresponding to the point and vertices of the three-dimensional structure, first graph edges corresponding to structure edges connecting the vertices of the three-dimensional structure, and second graph edges corresponding to other edges connecting the point to the vertices of the three-dimensional structure;
acquiring characteristic quantities of the structure data based on the produced graph; and
searching for a first three-dimensional structure similar to a second three-dimensional structure specified in a search query by comparing first characteristic quantities corresponding to the first three-dimensional structure with second characteristic quantities corresponding to the second three-dimensional structure,
wherein the calculating includes:
finding one of the spatial ranges that has a higher density of polygons than other spatial ranges by using a local search algorithm; and
determining coordinates of a point in the one of the spatial ranges that is found.

* * * * *